United States Patent
Yamamoto et al.

(10) Patent No.: US 9,601,708 B2
(45) Date of Patent: *Mar. 21, 2017

(54) ORGANIC LIGHT EMITTING DEVICE AND MATERIALS FOR USE IN SAME

(75) Inventors: Hitoshi Yamamoto, Pennington, NJ (US); Michael S. Weaver, Princeton, NJ (US); Julia J. Brown, Yardley, PA (US); Kazuki Nishimura, Chiba (JP); Toshihiro Iwakuma, China (JP); Tetsuya Inoue, Chiba (JP); Mitsunori Ito, Chiba (JP)

(73) Assignees: Universal Display Corporation, Ewing, NJ (US); Idemitsu Kosan Co., Ltd., Tokyo (JP)

( * ) Notice: Subject to any disclaimer, the term of this patent is extended or adjusted under 35 U.S.C. 154(b) by 603 days.

This patent is subject to a terminal disclaimer.

(21) Appl. No.: 13/995,319

(22) PCT Filed: Feb. 11, 2011

(86) PCT No.: PCT/US2011/024556
§ 371 (c)(1),
(2), (4) Date: Jun. 18, 2013

(87) PCT Pub. No.: WO2012/108881
PCT Pub. Date: Aug. 16, 2012

(65) Prior Publication Data
US 2013/0306963 A1    Nov. 21, 2013

(51) Int. Cl.
*H01L 51/50*    (2006.01)
*H01L 51/00*    (2006.01)

(52) U.S. Cl.
CPC ...... *H01L 51/5028* (2013.01); *H01L 51/0085* (2013.01); *H01L 51/0059* (2013.01); *H01L 51/0072* (2013.01); *H01L 51/5016* (2013.01)

(58) Field of Classification Search
None
See application file for complete search history.

(56) References Cited

U.S. PATENT DOCUMENTS

2010/0237339 A1    9/2010 Nomura
2011/0279020 A1*   11/2011 Inoue ............... C07D 209/82
                                                    313/504
(Continued)

FOREIGN PATENT DOCUMENTS

WO    2010111175 A1    9/2010

OTHER PUBLICATIONS

Official Action issued Nov. 25, 2014 in counterpart JP patent application No. 2013-553412.
(Continued)

*Primary Examiner* — Gregory Clark
(74) *Attorney, Agent, or Firm* — Duane Morris LLP

(57) ABSTRACT

The OLEDs of the present invention are characterized by providing an organic thin film layer comprising a single layer or plural layers between a cathode and an anode, wherein the organic thin film layer comprises at least one organic light emitting layer, wherein at least one light emitting layer comprises at least one host material and at least one phosphorescent emitter material, wherein the host material comprises a bis-carbazole derivative host material; and the phosphorescent emitter material comprises a phosphorescent organometallic complex having a substituted chemical structure represented by one of the following partial chemical structures represented by the formula:

LL'L"M wherein M is a metal that forms octahedral complexes, L, L', L" are equivalent or inequivalent bidentate ligands wherein each L comprises a substituted or unsubsti-
(Continued)

tuted phenylpyridine ligand coordinated to M through an sp2 hybridized carbon and N;

and one of L, L' and L" is inequivalent to at least one of the other two.

10 Claims, 1 Drawing Sheet

(56) References Cited

U.S. PATENT DOCUMENTS

2012/0138911 A1    6/2012   Inoue et al.
2012/0138915 A1    6/2012   Nishimura et al.
2014/0054564 A1    2/2014   Kim et al.

OTHER PUBLICATIONS

International Search Report issued for International Application No. PCT/US2011/024556, filing date Feb. 11, 2011, in the name of Universal Display Corporation.

* cited by examiner

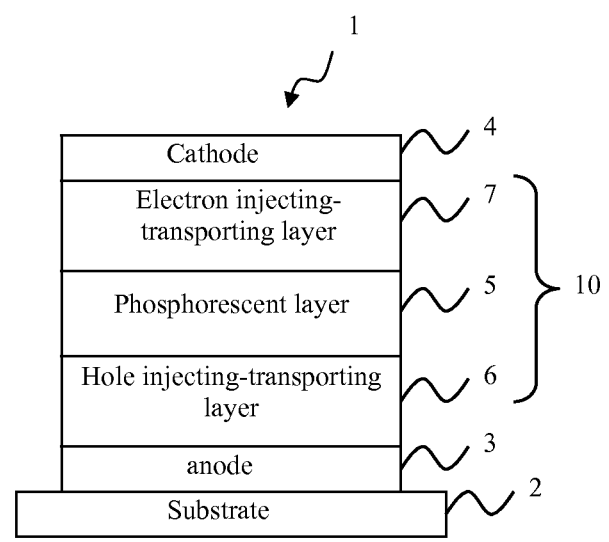

ORGANIC LIGHT EMITTING DEVICE AND MATERIALS FOR USE IN SAME

CROSS REFERENCE TO RELATED APPLICATION

The present application is a National Stage application, filed under 35 U.S.C. §371, of International Application No. PCT/US2011/024556, filed Feb. 11, 2011.

BACKGROUND OF THE INVENTION

The present invention relates to an organic electroluminescent (EL) device such as an organic light emitting device (hereinafter abbreviated as an OLED) and materials capable of being used in such an OLED. In particular, it relates to an OLED which comprises a light emitting layer which emits a green light, and materials for an OLED which are used for the same.

RELATED ART

OLEDs which comprise an organic thin film layer which includes a light emitting layer located between an anode and a cathode are known in the art. In such devices, emission of light may be obtained from exciton energy, produced by recombination of a hole injected into a light emitting layer with an electron.

Generally, OLEDs are comprised of several organic layers in which at least one of the layers can be made to electroluminesce by applying a voltage across the device (see, e.g., Tang, et al., Appl. Phys. Lett. 1987, 51, 913 and Burroughes, et al., Nature, 1990, 347, 359). When a voltage is applied across a device, the cathode effectively reduces the adjacent organic layers (i.e., injects electrons), and the anode effectively oxidizes the adjacent organic layers (i.e., injects holes). Holes and electrons migrate across the device toward their respective oppositely charged electrodes. When a hole and electron meet on the same molecule, recombination is said to occur, and an exciton is formed. Recombination of the hole and electron in luminescent compounds is accompanied by radiative emission, thereby producing electroluminescence.

Depending on the spin states of the hole and electron, the exciton resulting from hole and electron recombination can have either a triplet or singlet spin state. Luminescence from a singlet exciton results in fluorescence, whereas luminescence from a triplet exciton results in phosphorescence. Statistically, for organic materials typically used in OLEDs, one quarter of the excitons are singlets, and the remaining three-quarters are triplets (see, e.g., Baldo, et al., Phys. Rev. B, 1999, 60, 14422). Until the discovery that there were certain phosphorescent materials that could be used to fabricate practical electro-phosphorescent OLEDs (U.S. Pat. No. 6,303,238) and, subsequently, demonstration that such electro-phosphorescent OLEDs could have a theoretical quantum efficiency of up to 100% (i.e., harvesting all of both triplets and singlets), the most efficient OLEDs were typically based on materials that fluoresced. Fluorescent materials luminesce with a maximum theoretical quantum efficiency of only 25% (where quantum efficiency of an OLED refers to the efficiency with which holes and electrons recombine to produce luminescence), since the triplet to ground state transition of phosphorescent emission is formally a spin forbidden process. Electro-phosphorescent OLEDs have now been shown to have superior overall device efficiencies as compared with electro-fluorescent OLEDs (see, e.g., Baldo, et al., Nature, 1998, 395, 151 and Baldo, et al., Appl. Phys. Lett. 1999, 75(3), 4).

Due to strong spin-orbit coupling that leads to singlet-triplet state mixing, heavy metal complexes often display efficient phosphorescent emission from such triplets at room temperature. Accordingly, OLEDs comprising such complexes have been shown to have internal quantum efficiencies of more than 75% (Adachi, et al., Appl. Phys. Lett., 2000, 77, 904). Certain organometallic iridium complexes have been reported as having intense phosphorescence (Lamansky, et al., Inorganic Chemistry, 2001, 40, 1704), and efficient OLEDs emitting in the green to red spectrum have been prepared with these complexes (Lamansky, et al., J. Am. Chem. Soc., 2001, 123, 4304). Phosphorescent heavy metal organometallic complexes and their respective devices have been the subject of U.S. Pat. Nos. 6,830,828 and 6,902,830; U.S. Publications 2006/0202194 and 2006/0204785; and U.S. Pat. Nos. 7,001,536; 6,911,271; 6,939,624; and 6,835,469.

OLEDs, as described above, generally provide excellent luminous efficiency, image quality, power consumption and the ability to be incorporated into thin design products such as flat screens, and therefore hold many advantages over prior technology, such as cathode ray devices.

However, improved OLEDs, including, for example, the preparation of OLEDs having greater current efficiency are desirable. In this regard, light emitting materials (phosphorescent materials) have been developed in which light emission is obtained from a triplet exciton in order to enhance internal quantum efficiency.

As discussed above, such OLEDs can have a theoretical internal quantum efficiency up to 100% by using such phosphorescent materials in the light emitting layer (phosphorescent layer), and the resulting OLED will have a high efficiency and low power consumption. Such phosphorescent materials may be used as a dopant in a host material which comprises such a light emitting layer.

In a light emitting layer formed by doping with a light emitting material such as a phosphorescent material, excitons can efficiently be produced from a charge injected into a host material. Exciton energy of an exciton produced may be transferred to a dopant, and emission may be obtained from the dopant at high efficiency. Exitons may be formed either on the host materials or directly on the dopant.

In order to achieve intermolecular energy transfer from a host material to a phosphorescent dopant with high device efficiencies, the excited triplet energy EgH of the host material must be greater than the excited triplet energy EgD of the phosphorescent dopant.

In order to carry out intermolecular energy transfer from a host material to a phosphorescent dopant, an excited triplet energy Eg (T) of the host material has to be larger than an excited triplet energy Eg (S) of the phosphorescent dopant.

CBP (4,4'-bis(N-carbazolyl)biphenyl) is known to be a representative example of a material having an efficient and large excited triplet energy. See, e.g., U.S. Pat. No. 6,939,624. If CBP is used as a host material, energy can be transferred to a phosphorescent dopant having a prescribed emission wavelength, such as green, and an OLED having a high efficiency can be obtained. When CBP is used as a host material, the luminous efficiency is notably enhanced by phosphorescent emission. However, CBP is known to have a very short lifetime, and therefore it is not suitable for practical use in EL devices such as an OLED. Without being bound by scientific theory, it is believed that this is because CBP may be heavily deteriorated by a hole due to its oxidative stability not being high, in terms of molecular structure.

International Patent Application Publication WO 2005/112519 discloses a technique in which a condensed ring derivative having a nitrogen-containing ring such as carbazole and the like is used as a host material for a phosphorescent layer showing green phosphorescence. The current efficiency and the lifetime are improved by the above technique, but it is not satisfactory in a certain case for practical use.

On the other hand, a wide variety of host materials (fluorescent hosts) for a fluorescent dopant showing fluorescent emission are known, and various host materials can be proposed which, by combination with a fluorescent dopant, may form a fluorescent layer which exhibits excellent luminous efficiency and lifetime.

In a fluorescent host, an excited singlet energy Eg (S) is larger than in a fluorescent dopant, but an excited triplet energy Eg (T) of such a host is not necessarily larger. Accordingly, a fluorescent host cannot simply be used in place of a phosphorescent host as a host material to provide a phosphorescent emitting layer.

For example, anthracene derivatives are known well as a fluorescent host. However, an excited state triplet energy Eg (T) of anthracene derivatives may be as small as about 1.9 eV. Thus, energy transfer to a phosphorescent dopant having an emission wavelength in a visible light region of 500 nm to 720 nm cannot be achieved using such a host, since the excited state triplet energy would be quenched by a host having such a low triplet state energy. Accordingly, anthracene derivatives are unsuitable as a phosphorescent host.

Perylene derivatives, pyrene derivatives and naphthacene derivatives are not preferred as phosphorescent hosts for the same reason.

The use of aromatic hydrocarbon compounds as phosphorescent hosts is disclosed in Japanese Patent Application Laid-Open No. 142267/2003. That application discloses phosphorescent host compounds with a benzene skeleton core and with two aromatic substituents bonded at meta positions.

However, the aromatic hydrocarbon compounds described in Japanese Patent Application Laid-Open No. 142267/2003 assume a rigid molecular structure having a good symmetric property and provided with five aromatic rings in which molecules are arranged in a bilaterally symmetrical manner toward a central benzene skeleton. Such an arrangement has the drawback of a likelihood of crystallization of the light emitting layer.

On the other hand, OLEDs in which various aromatic hydrocarbon compounds are used are disclosed in International Patent Application Publications WO 2007/046685; Japanese Patent Application Laid-Open No. 151966/2006; Japanese Patent Application Laid-Open No. 8588/2005; Japanese Patent Application Laid-Open No. 19219/2005; Japanese Patent Application Laid-Open No. 19219/2005; and Japanese Patent Application Laid-Open No. 75567/2004. However, the efficiency of these materials as a phosphorescent host is not disclosed.

In addition, OLEDs prepared by using various fluorene compounds are disclosed in Japanese Patent Application Laid-Open No. 043349/2004; Japanese Patent Application Laid-Open No. 314506/2007; and Japanese Patent Application Laid-Open No. 042485/2004. However, the effectiveness of these materials as a phosphorescent host is not disclosed.

Further, Japanese Patent Application Laid-Open No. 042485/2004 discloses hydrocarbon compounds in which a condensed polycyclic aromatic ring is bonded directly to a fluorene ring. However, the effectiveness of an OLED prepared by combining such materials with a phosphorescent material is not disclosed, and the application discloses perylene and pyrene rings which are known to have a small triplet energy level as condensed polycyclic aromatic rings, and which are not preferred for use as a light emitting layer of a phosphorescent device, and materials which are effective for a phosphorescent device are not selected.

Despite the recent discoveries of efficient heavy metal phosphors and the resulting advancements in OLED technology, there remains a need for even greater high temperature device stability. In addition, there still remains a need for host materials which can transfer energy to a phosphorescent material with high efficiency and with an extended lifetime. Fabrication of devices that have longer high temperature lifetimes will contribute to the development of new display technologies and help realize the current goals toward full color electronic display on flat surfaces. The OLEDs and the host materials and phosphorescent emitter materials comprised in such OLEDs, described herein, help fulfill this objective.

SUMMARY OF THE INVENTION

The OLEDs of the present invention are characterized by providing an organic thin film layer comprising a single layer or plural layers between a cathode and an anode, wherein the organic thin film layer comprises at least one organic light emitting layer, wherein at least one light emitting layer comprises at least one host material and at least one phosphorescent emitter material, wherein the host material comprises a biscarbazole derivative represented by the formula (1):

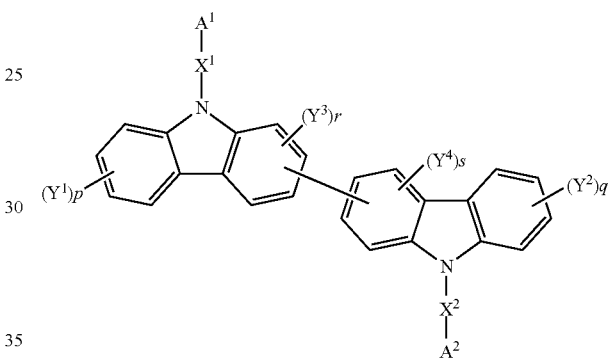

(1)

wherein $A^1$ represents a substituted or unsubstituted nitrogen-containing heterocyclic group having 1 to 30 ring-forming carbon atoms, the nitrogen-containing heterocyclic group not being a substituted or unsubstituted carbazolyl group and a substituted or unsubstituted indolyl group;

$A^2$ represents a substituted or unsubstituted aromatic hydrocarbon group having 6 to 30 ring-forming carbon atoms or a substituted or unsubstituted nitrogen-containing heterocyclic group having 1 to 30 ring-forming carbon atoms;

$X^1$ and $X^2$ are bonding groups, $X^1$ and $X^2$ respectively independently representing:
  a single bond;
  a substituted or unsubstituted aromatic hydrocarbon group having 6 to 30 ring-forming carbon atoms;
  a substituted or unsubstituted condensed aromatic hydrocarbon group having 6 to 30 ring-forming carbon atoms;
  a substituted or unsubstituted aromatic heterocyclic group having 2 to 30 ring-forming carbon atoms; or
  a substituted or unsubstituted condensed aromatic heterocyclic group having 2 to 30 ring-forming carbon atoms;

$Y^1$ to $Y^4$ respectively independently represent;
  a hydrogen atom;
  a fluorine atom;
  a cyano group;
  a substituted or unsubstituted alkyl group having 1 to 20 carbon atoms;
  a substituted or unsubstituted alkoxy group having 1 to 20 carbon atoms;
  a substituted or unsubstituted haloalkyl group having 1 to 20 carbon atoms;

a substituted or unsubstituted haloalkoxy group having 1 to 20 carbon atoms;

a substituted or unsubstituted alkylsilyl group having 1 to 10 carbon atoms;

a substituted or unsubstituted arylsilyl group having 6 to 30 carbon atoms;

a substituted or unsubstituted aromatic hydrocarbon group having 6 to 30 ring-forming carbon atoms;

a substituted or unsubstituted condensed aromatic hydrocarbon group having 6 to 30 ring-forming carbon atoms;

a substituted or unsubstituted aromatic heterocyclic group having 2 to 30 ring-forming carbon atoms; or a substituted or unsubstituted condensed aromatic heterocyclic group having 2 to 30 ring-forming carbon atoms, adjacent ones of $Y^1$ to $Y^4$ being bondable with each other to form a ring structure, and p and q represent integers in a range from 1 to 4 and r and s represent integers in a range from 1 to 3, $Y^1$ to $Y^4$ being the same as or different from each other when p and q represent integers in a range from 2 to 4 and r and s represent integers in a range from 2 to 3.

In another embodiment, the OLED comprises a host material having the chemical structure represented by the formula (GH-1):

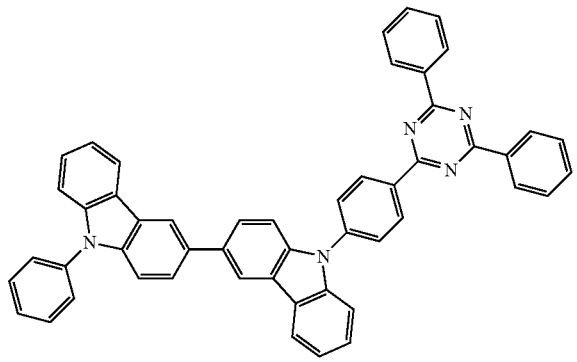
(GH-1)

In one embodiment of the present invention, the phosphorescent emitter material comprises a phosphorescent organometallic complex having a substituted chemical structure represented by:

LL'L"M wherein M is a metal that forms octahedral complexes, L, L', L" are equivalent or inequivalent bidentate ligands wherein each L comprises a substituted or unsubstituted phenylpyridine ligand coordinated to M through an $sp^2$ hybridized carbon and N; and, one of L, L' and L" is inequivalent to at least one of the other two.

In another embodiment, the phosphorescent emitter material comprises a phosphorescent organometallic compound having a substituted chemical structure represented by the following chemical structure (2):

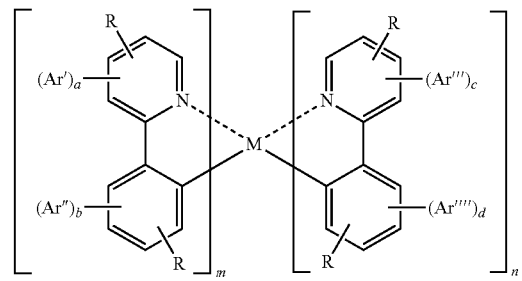
(2)

where each R is independently selected from the group consisting of H, alkyl, alkenyl, alkynyl, alkylaryl, CN, $CF_3$, $C_nF_{2n+1}$, trifluorovinyl, $CO_2R$, $C(O)R$, $NR_2$, $NO_2$, OR, halo, aryl, heteroaryl, substituted aryl, substituted heteroaryl or a heterocyclic group;

Ar', Ar", Ar''' and Ar'''' each independently represent a substituted or unsubstituted aryl or heteroaryl unfused substituent on the phenylpyridine ligand;

a is 0 or 1;
b is 0 or 1;
c is 0 or 1;
d is 0 or 1;
m is 1 or 2;
n is 1 or 2;
m+n is the maximum number of ligands that can be coordinated to M; and wherein at least one of a, b, c, and d is 1 and when at least one of a and b is 1 and at least one of b and c is 1, at least one of Ar' and Ar" is different from at least one of Ar''' and Ar''''.

In another embodiment, the phosphorescent emitter material comprises a metal complex, and the metal complex comprises a metal atom selected from Ir, Pt, Os, Au, Cu, Re and Ru and a ligand. In yet another embodiment the metal complex has an ortho-metal bond. In preferred embodiments, Ir is the metal atom.

In another embodiment, the phosphorescent emitter material comprises a phosphorescent organometallic complex having a substituted chemical structure represented by the following partial chemical structure (GD-1):

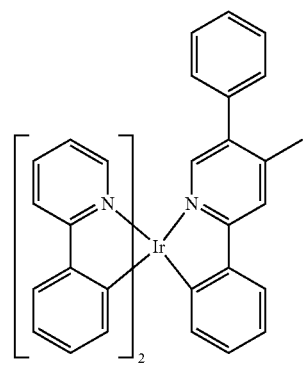
(GD-1)

In another embodiment, the present invention comprises an OLED which comprises a host material which comprises an unsubstituted aromatic hydrocarbon compound having the chemical structure represented by the formula (GH-1):

(GH-1)

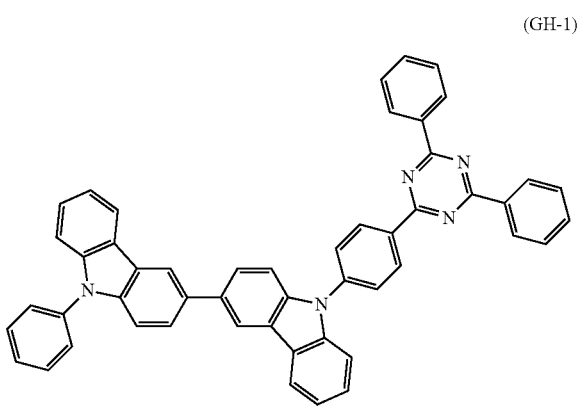 [SMILES: c1ccc(-c2nc(-c3ccccc3)nc(-c3ccc(-n4c5ccccc5c5cc(-c6ccc7c(c6)c6ccccc6n7-c6ccccc6)ccc54)cc3)n2)cc1]

and a phosphorescent emitter material which comprises a phosphorescent organometallic compound having a substituted chemical structure represented by the following chemical structure:

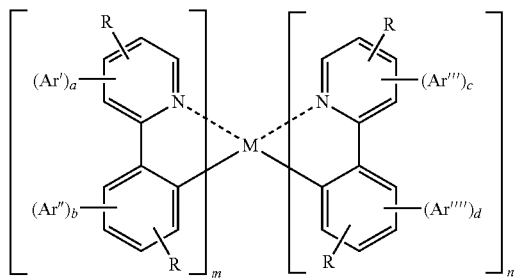

where each R is independently selected from the group consisting of H, alkyl, alkenyl, alkynyl, alkylaryl, CN, $CF_3$, $C_nF_{2n+1}$, trifluorovinyl, $CO_2R$, $C(O)R$, $NR_2$, $NO_2$, OR, halo, aryl, heteroaryl, substituted aryl, substituted heteroaryl or a heterocyclic group;

Ar', Ar", Ar''' and Ar'''' each independently represent a substituted or unsubstituted aryl or heteroaryl unfused substituent on the phenylpyridine ligand;

a is 0 or 1;
b is 0 or 1;
c is 0 or 1;
d is 0 or 1;
m is 1 or 2;
n is 1 or 2;
m+n is the maximum number of ligands that can be coordinated to M; and wherein at least one of a, b, c, and d is 1 and when at least one of a and b is 1 and at least one of b and c is 1, at least one of Ar' and Ar" is different from at least one of Ar''' and Ar''''.

In one embodiment, the present invention comprises an OLED which comprises a host material, wherein the triplet energy of the host material is from about 2.0 eV to about 2.8 eV.

In another embodiment, the present invention comprises an OLED which comprises at least one phosphorescent material in the light emitting layer, wherein the phosphorescent material has a maximum value of 500 nm or more and 720 nm or less in a light emitting wavelength.

In another embodiment, the present invention comprises an OLED which provides improved voltage and working lifetime characteristics. Without being bound by theory, it is believed that improved characteristics of the OLEDs of the present invention may be achieved due to the serial bonding of two or more condensed polycyclic aromatic rings to a monovalent fluorene skeleton and by bonding a group containing condensed polycyclic aromatic rings which are different from each other to a fluorene skeleton in a position in which a conjugate length is extended.

In another embodiment, the present invention comprises a phosphorescent OLED having high efficiency and long lifetime, which OLED comprises a material of general Formula (GH-1) as a host material, and particularly as a phosphorescent host material.

BRIEF DESCRIPTION OF THE DRAWING

FIG. 1 is a drawing showing an outline constitution of one example of the OLED in the embodiment of the present invention.

DETAILED DESCRIPTION

The OLEDs of the present invention may comprise a plurality of layers located between an anode and a cathode. Representative OLEDs according to the invention include, but are not limited to, structures having constituent layers as described below:

(1) Anode/light emitting layer/cathode;
(2) Anode/hole injecting layer/light emitting layer/cathode;
(3) Anode/light emitting layer/electron injecting•transporting layer/cathode;
(4) Anode/hole injecting layer/light emitting layer/electron injecting•transporting layer/cathode;
(5) Anode/organic semiconductor layer/light emitting layer/cathode;
(6) Anode/organic semiconductor layer/electron blocking layer/light emitting layer/cathode;
(7) Anode/organic semiconductor layer/light emitting layer/adhesion improving layer/cathode;
(8) Anode/hole injecting•transporting layer/light emitting layer/electron injecting•transporting layer/cathode;
(9) anode/insulating layer/light emitting layer/insulating layer/cathode;
(10) anode/inorganic semiconductor layer/insulating layer/light emitting layer/insulating layer/cathode;
(11) anode/organic semiconductor layer/insulating layer/light emitting layer/insulating layer/cathode;
(12) anode/insulating layer/hole injecting•transporting layer/light emitting layer/insulating layer/cathode; and
(13) anode/insulating layer/hole injecting•transporting layer/light emitting layer/electron injecting•transporting layer/cathode.

Among the OLED constituent structures described above, constituent structure number 8 is a preferred structure, but the present invention is not limited to these disclosed constituent structures.

A schematic constitution of one example of an OLED in an embodiment of the present invention is shown in FIG. 1. As a representative embodiment of the invention, an OLED 1 comprises a transparent substrate 2, an anode 3, a cathode 4 and an organic thin film layer 10 disposed between the anode 3 and the cathode 4.

The organic thin film layer 10 comprises a phosphorescence emitting layer 5 containing a phosphorescent host and a phosphorescent dopant, and can provide respectively a hole injecting•transporting layer 6 and the like between the phosphorescence emitting layer and the anode 3, and an electron injecting•transporting layer 7 and the like between the phosphorescence emitting layer 5 and the cathode 4.

Further, there may be provided respectively an electron blocking layer disposed between the anode 3 and the phosphorescence emitting layer 5, and a hole blocking layer disposed between the cathode 4 and the phosphorescence emitting layer 5. This makes it possible to contain electrons and holes in the phosphorescence emitting layer 5 to enhance the production rate of excitons in the phosphorescence emitting layer 5.

In the present specification, the terms "fluorescent host" and "phosphorescent host" are referred to as a fluorescent host when combined with a fluorescent dopant and as a phosphorescent host when combined with a phosphorescent dopant, respectively, and should not be limited to a classification of the host material based solely on molecular structure.

Accordingly, a fluorescent host in the present specification means a material constituting the fluorescence emitting layer containing a fluorescent dopant and does not mean a material which can be used only for a host of a fluorescent material.

Similarly, a phosphorescent host means a material constituting the phosphorescence emitting layer containing a phosphorescent dopant and does not mean a material which can be used only for a host of a phosphorescent material.

In the present specification, "a hole injecting•transporting layer" means at least either one of a hole injecting layer and a hole transporting layer, and "an electron injecting•transporting layer" means at least either one of an electron injecting layer and an electron transporting layer.

Substrate

The OLED of the present invention may be prepared on a substrate. The substrate referred to in this case is a substrate for supporting the OLED, and it is preferably a flat substrate in which light in the visible region of about 400 to about 700 nm has a transmittance of at least about 50%.

The substrate may include a glass plate, a polymer plate and the like. In particular, the glass plate may include soda lime glass, barium.strontium-containing glass, lead glass, aluminosilicate glass, borosilicate glass, barium borosilicate glass, quartz and the like. The polymer plate may include polycarbonate, acryl, polyethylene terephthalate, polyether sulfide, polysulfone and the like.

Anode and Cathode

An anode in the OLED of the present invention assumes the role of injecting a hole into the hole injecting layer, the hole transporting layer or the light emitting layer. Typically the anode has a work function of 4.5 eV or more.

Specific examples of a material suitable for use as the anode include indium tin oxide alloy (ITO), tin oxide (NESA), indium zinc oxide, gold, silver, platinum, copper and the like.

The anode can be prepared by forming a thin film from electrode substances, such as those discussed above, by a method such as a vapor deposition method, a sputtering method and the like.

When light is emitted from the light emitting layer, the transmittance of light in the visible light region in the anode is preferably larger than 10%. The sheet resistance of the anode is preferably several hundred Ω/square or less. The film thickness of the anode is selected, depending on the material, and is typically in the range of from about 10 nm to about 1 μm, and preferably from about 10 nm to about 200 nm.

The cathode comprises preferably a material having a small work function for the purpose of injecting an electron into the electron injecting layer, the electron transporting layer or the light emitting layer. Materials suitable for use as the cathode include, but are not limited to indium, aluminum, magnesium, magnesium-indium alloys, magnesium-aluminum alloys, aluminum-lithium alloys, aluminum-scandium-lithium alloys, magnesium-silver alloys and the like. For transparent or top-emitting devices, a TOLED cathode such as disclosed in U.S. Pat. No. 6,548,956 is preferred.

The cathode can be prepared, as is the case with the anode, by forming a thin film by a method such as a vapor deposition method, a sputtering method and the like. Further, an embodiment in which light emission is taken out from a cathode side can be employed as well.

Light Emitting Layer

The light emitting layer in the OLED may be capable of carrying out the following functions singly or in combination:

(1) injecting function: a function in which a hole can be injected from an anode or a hole injecting layer in applying an electric field and in which an electron can be injected from a cathode or an electron injecting layer;

(2) transporting function: a function in which a charge (electron and hole) injected may be transferred by virtue of a force of an electric field; and (3) light emitting function: a function in which a region for recombination of an electron and a hole may be provided, and which results in the emission of light.

A difference may be present between ease of injection of a hole and ease of injection of an electron, and a difference may be present in the transporting ability shown by the mobilities of a hole and an electron.

Known methods including, for example, vapor deposition, spin coating, Langmuir Blodgett methods and the like can be used to prepare the light emitting layer. The light emitting layer is preferably a molecularly deposited film. In this regard, the term "molecularly deposited film" means a thin film formed by depositing a compound from the gas phase and a film formed by solidifying a material compound in a solution state or a liquid phase state, and usually the above-referenced molecular deposit film can be distinguished from a thin film (molecular accumulation film) formed by an LB method by a difference in an aggregation structure and a higher order structure and a functional difference originating in it.

In preferred embodiments, the film thickness of the light emitting layer is preferably from about 5 to about 50 nm, more preferably from about 7 to about 50 nm and most preferably from about 10 to about 50 nm. If the film thickness is less than 5 nm, it is likely to be difficult to form the light emitting layer and control the chromaticity. On the other hand, if it exceeds about 50 nm, the operating voltage is likely to go up.

OLEDs

In an OLED of the present invention, an organic thin film layer comprising one layer or plural layers is provided between a cathode and an anode; the above organic thin film layer comprises at least one light emitting layer; and at least one of the organic thin film layers contains at least one phosphorescent material and at least one host material as described below. Further, at least one of the light emitting layers contains preferably at least one host material of the present invention for an organic electroluminescence device and at least one phosphorescent material.

As described above, a phosphorescence emitting layer having high efficiency and long lifetime can be prepared according to the teachings of the present invention, especially a high stability at high operating temperatures.

In this regard, an excited triplet energy gap Eg(T) of the material constituting the OLED of the invention may be prescribed based on its phosphorescence emission spectrum, and it is given as an example in the present invention that the energy gap may be prescribed, as is commonly used, in the following manner The respective materials are dissolved in an EPA solvent (diethyl ether:isopentane:ethanol=5:5:2 in terms of a volume ratio) in a concentration of 10 mmol/L to prepare a sample for measuring phosphorescence. This phosphorescence measuring sample is placed in a quartz cell and cooled to 77 K, and is subsequently irradiated with exciting light to measure the wavelength of a phosphorescence emitted.

A tangent line is drawn based on the increase of phosphorescence emission spectrum thus obtained at the short wavelength side, and the wavelength value of the intersection point of the above tangent line and the base line is converted to an energy value, which is set as an excited triplet energy gap Eg(T). A commercially available measuring equipment F-4500 (manufactured by Hitachi, Ltd.) can be used for the measurement.

However, a value which can be defined as the triplet energy gap can be used without depending on the above procedure as long as it does not deviate from the scope of the present invention.

A preferred host material has the chemical structure represented by the formula (GH-1):

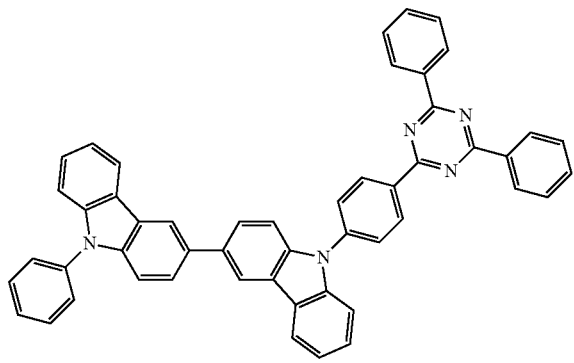
(GH-1)

The materials of the present invention for an organic electroluminescence device have a large triplet energy gap Eg(T) (excited triplet energy), and therefore phosphorescent light can be emitted by transferring energy to a phosphorescent dopant.

In the present invention, the excited triplet energy of the host material described above is preferably from about 2.0 eV to about 2.8 eV. The excited triplet energy of about 2.0 eV or more makes it possible to transfer energy to a phosphorescent dopant material which emits light at a wavelength of 500 nm or more and 720 nm or less. The excited triplet energy of about 2.8 eV or less makes it possible to avoid the problem that light emission is not efficiently carried out in a green phosphorescent dopant because of the large difference in an energy gap. The excited triplet energy of the host material is more preferably from about 2.1 eV to about 2.7 eV.

Specific examples of suitable compounds for the host material according to the present invention, represented by the following formulas (A1-A130), include, but are not limited to, the following compounds:

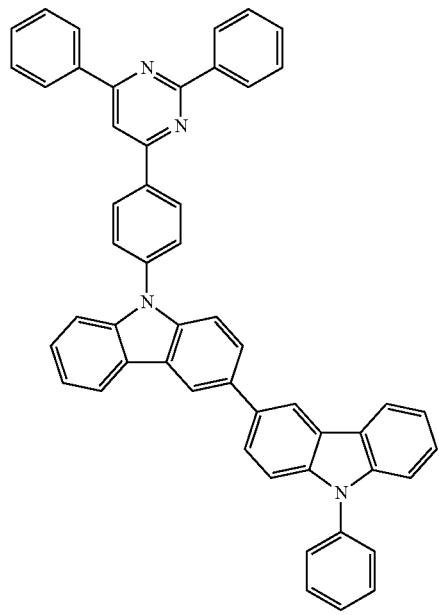
(A1)

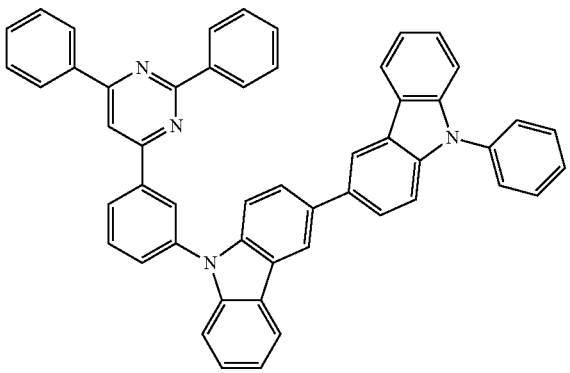
(A2)

(A3)
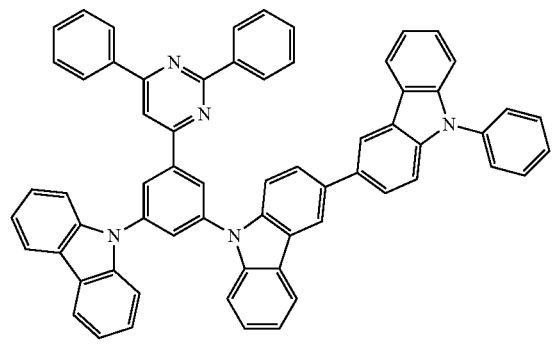
(A4)
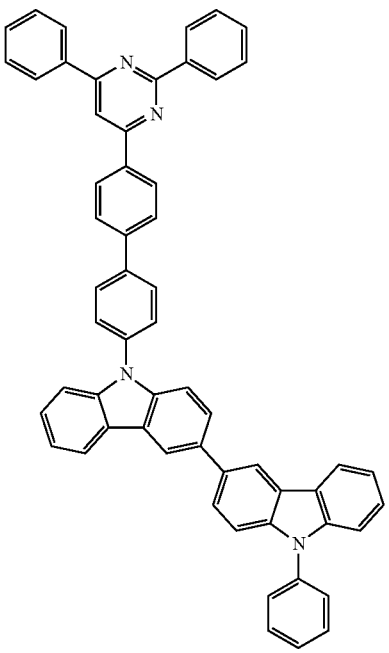
(A5)
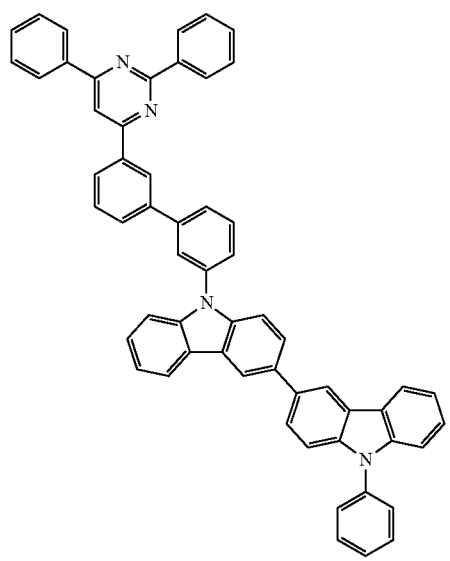
(A6)
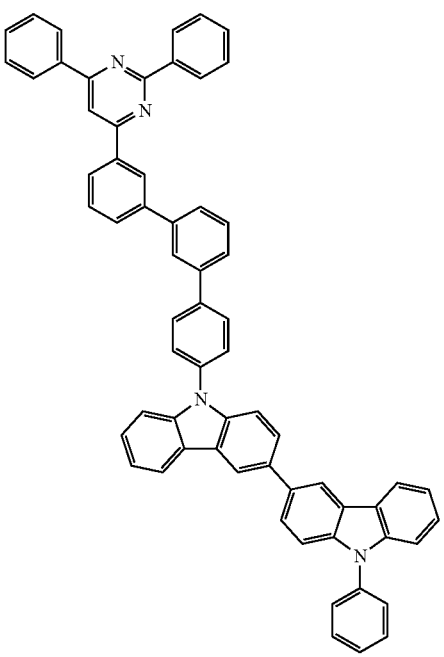

(A7)
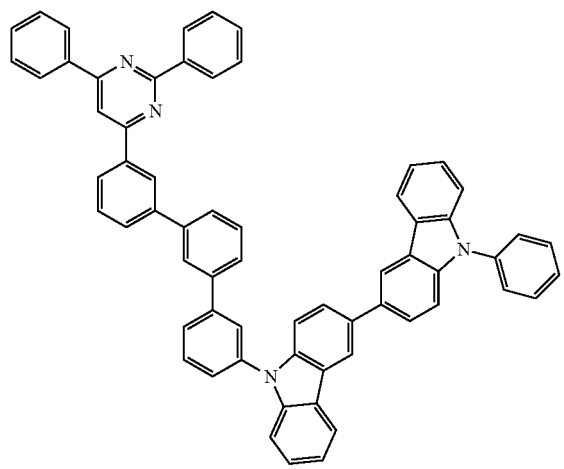
(A8)
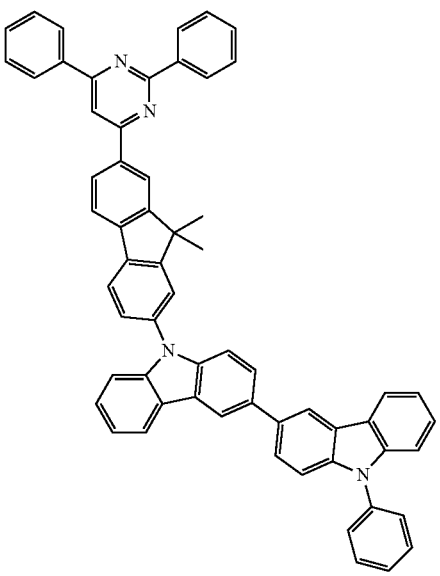
(A9)
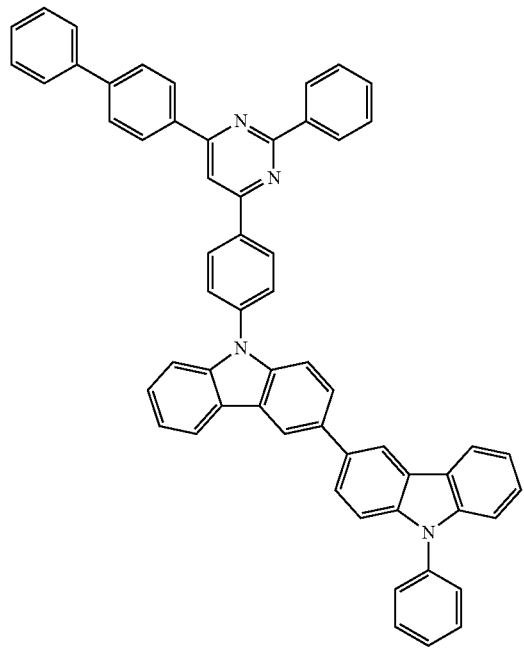
(A10)

-continued
(A11)
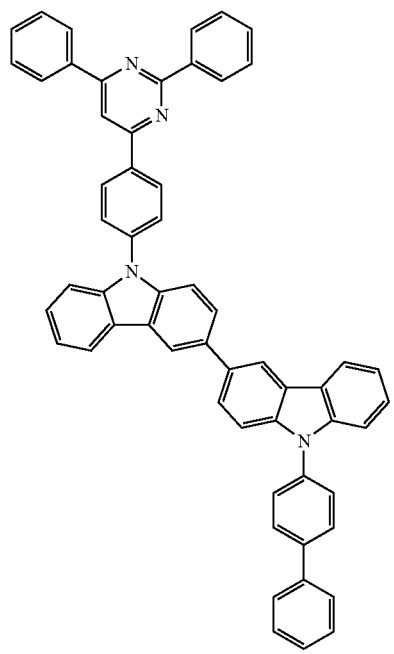
(A12)
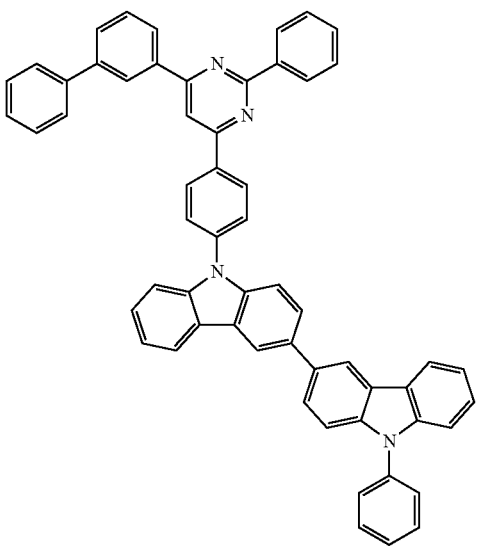
(A13)
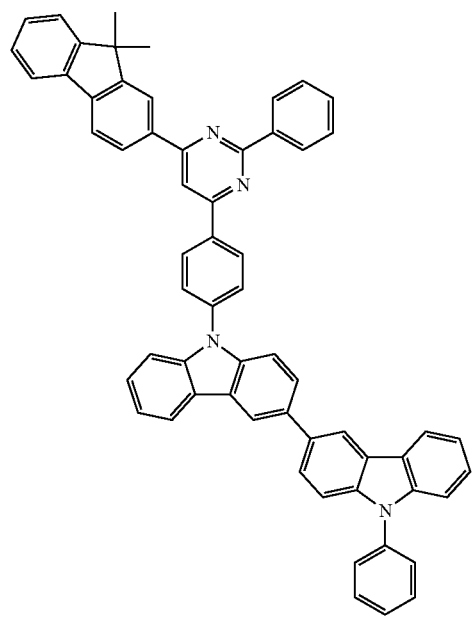
(A14)
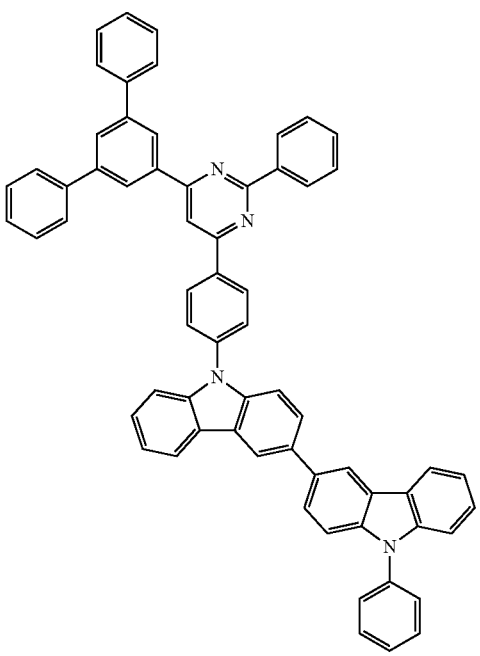

-continued
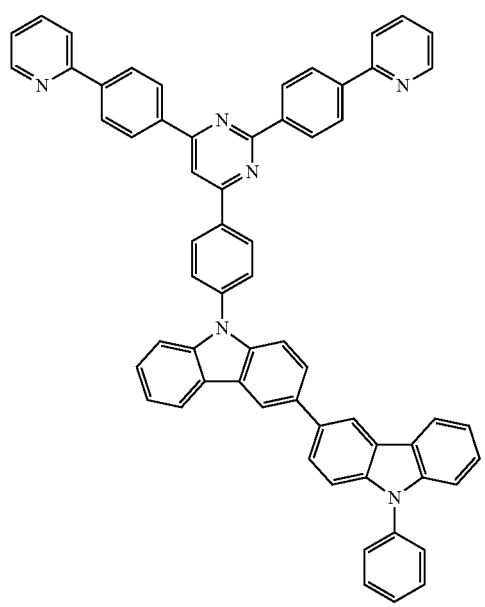
(A15)
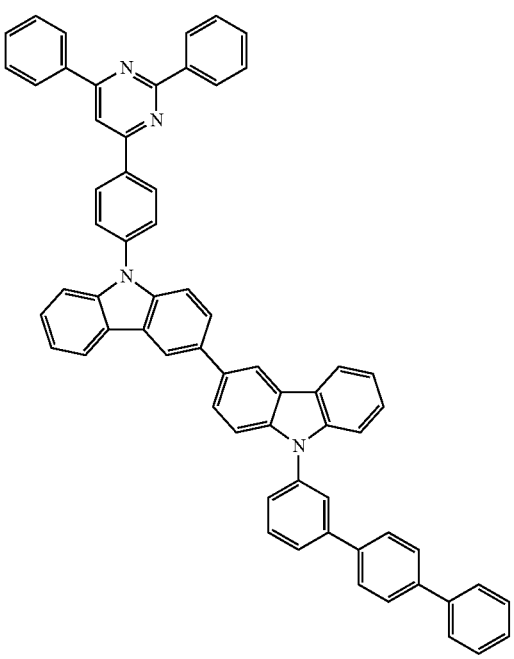
(A16)
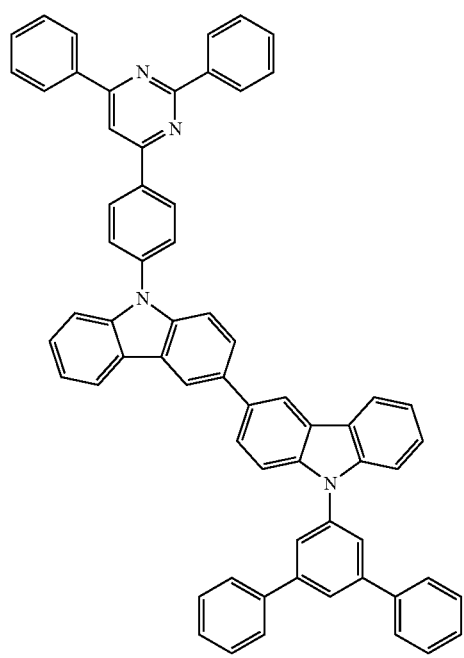
(A17)
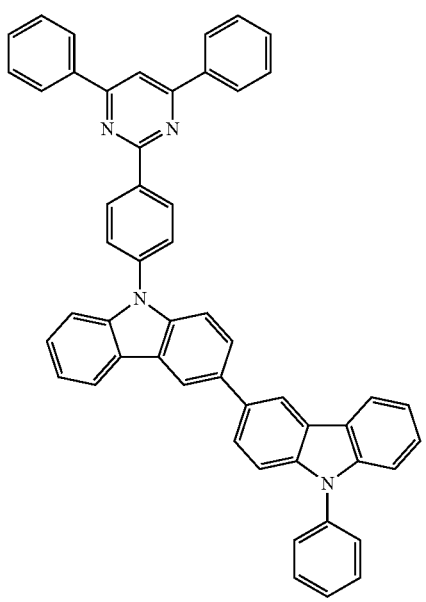
(A18)
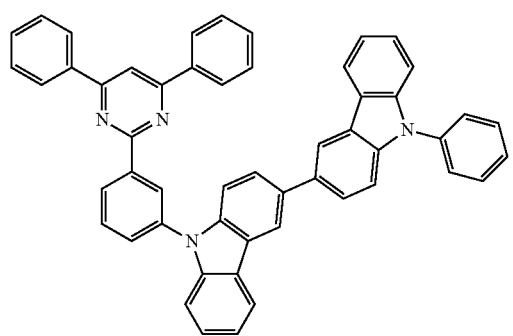
(A19)
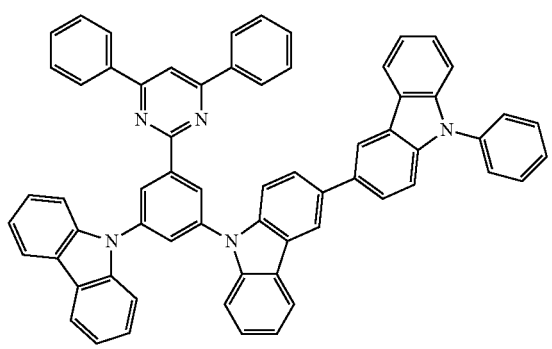
(A20)

-continued
(A21)
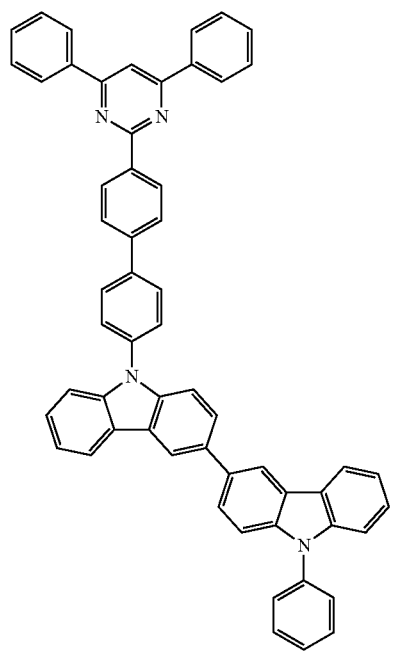
(A22)
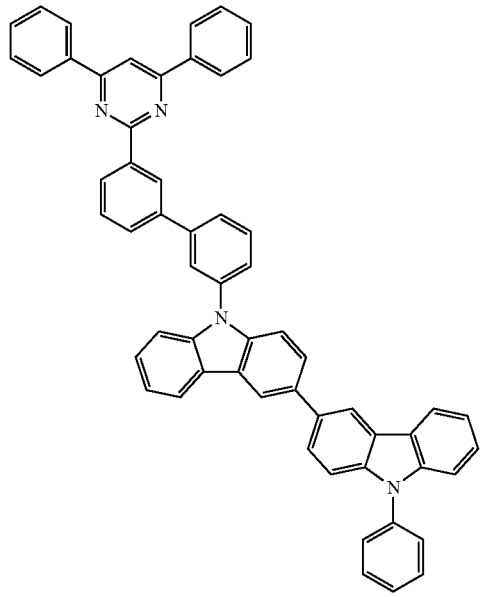
(A23)
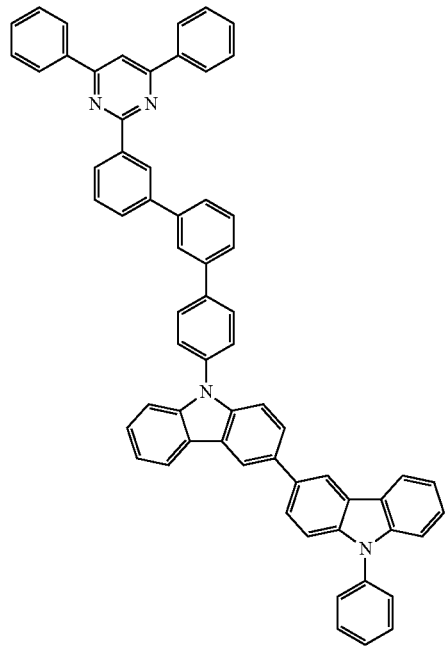
(A24)
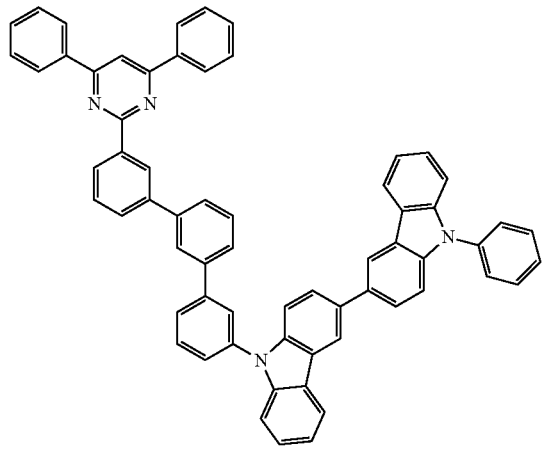

(A25)
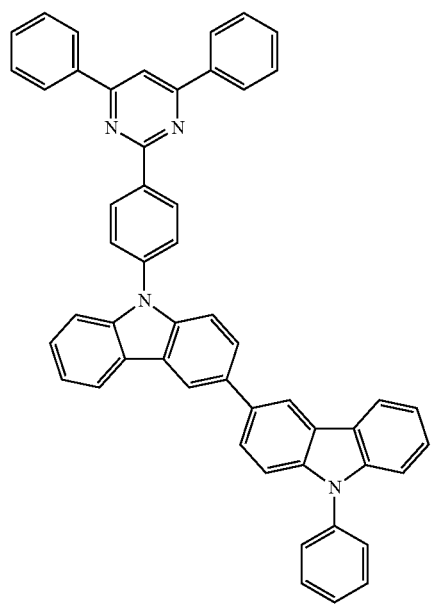
(A26)
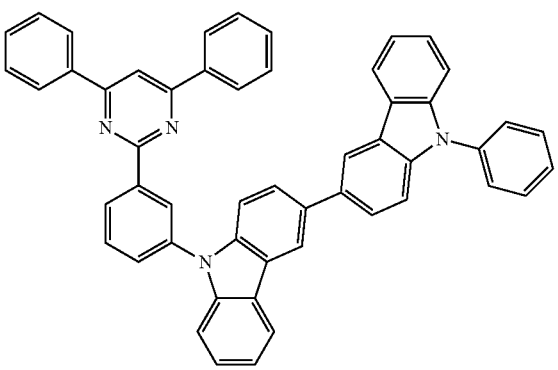
(A27)
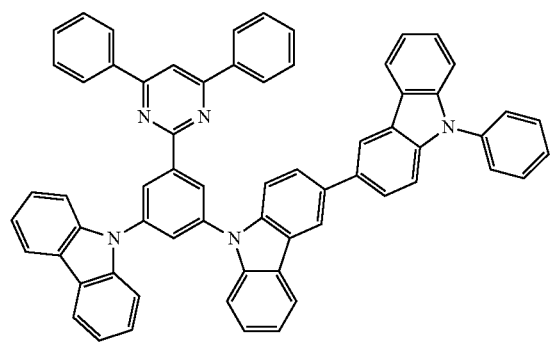
(A28)
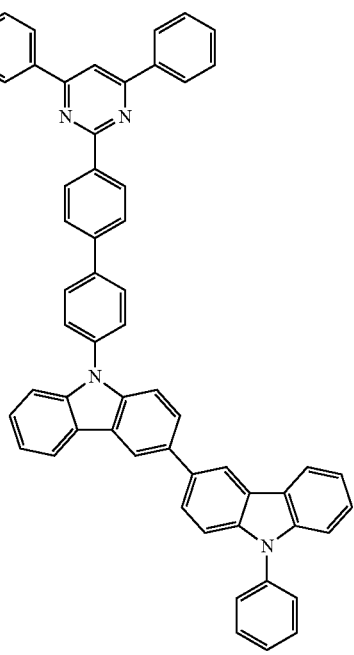

-continued
(A29)
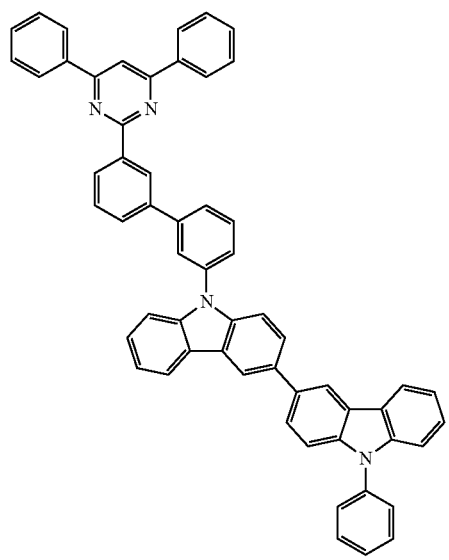
(A30)
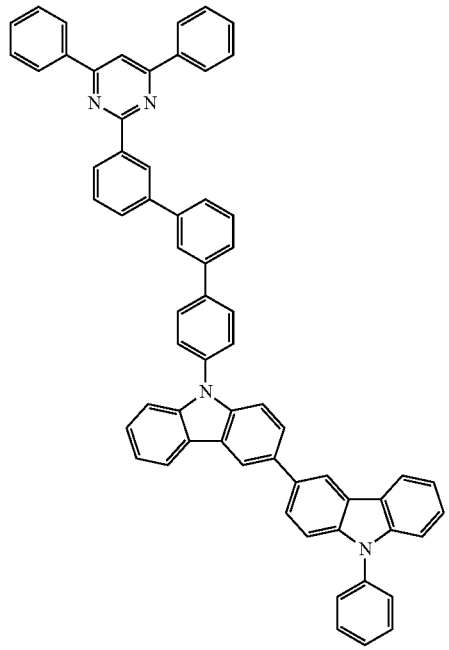
(A31)
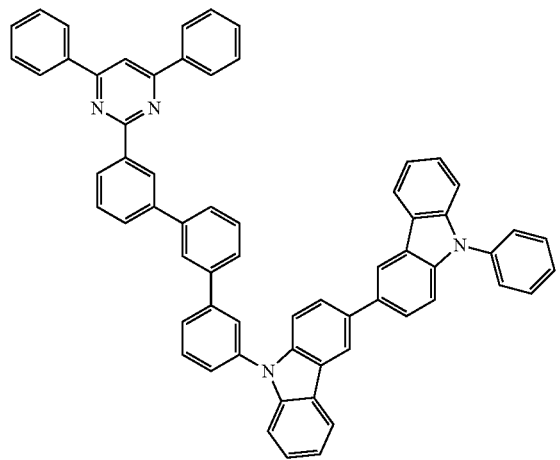
(A32)
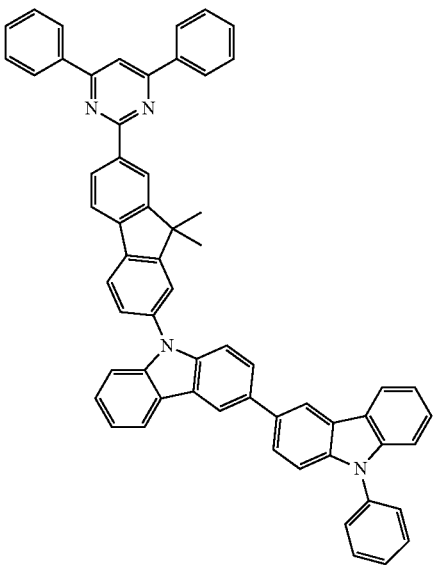

-continued
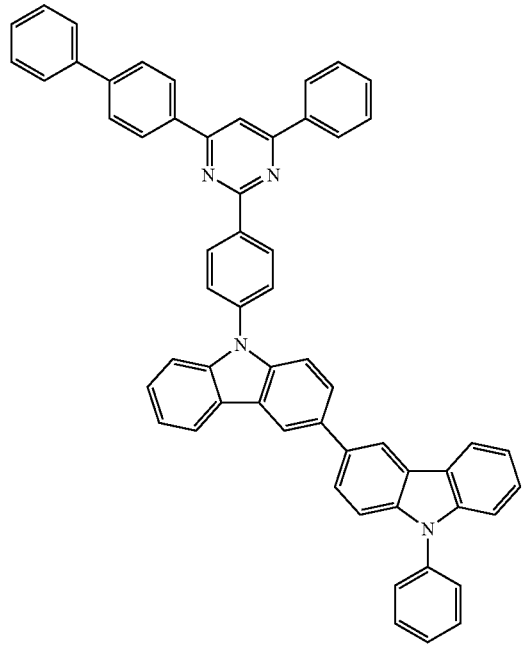
(A33)
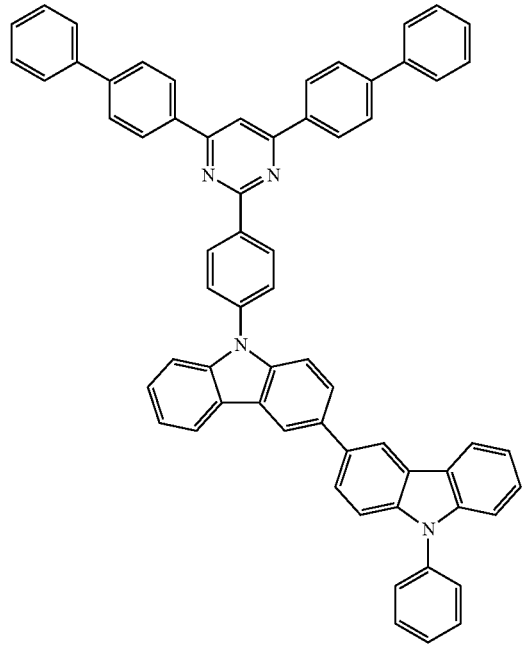
(A34)
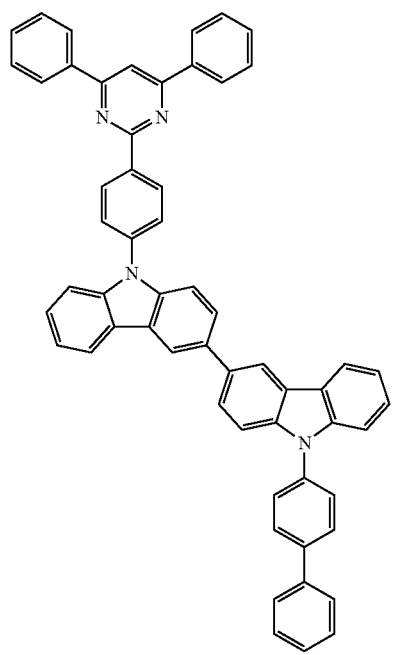
(A35)
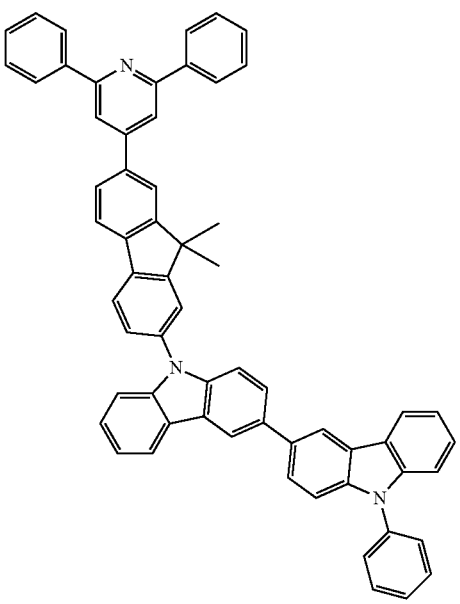
(A36)

-continued
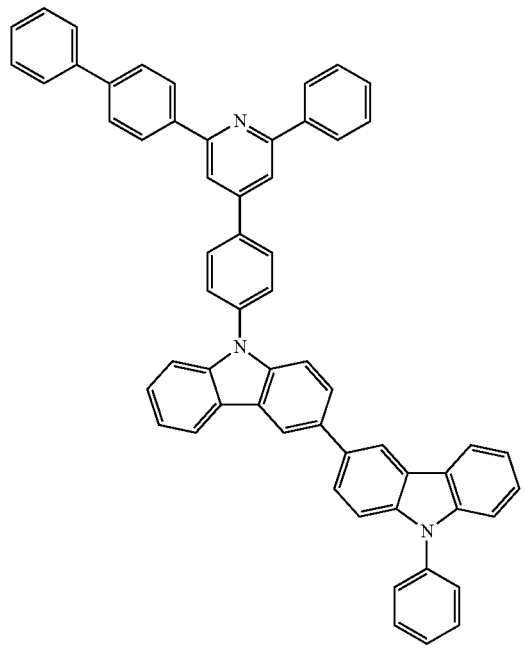
(A37)
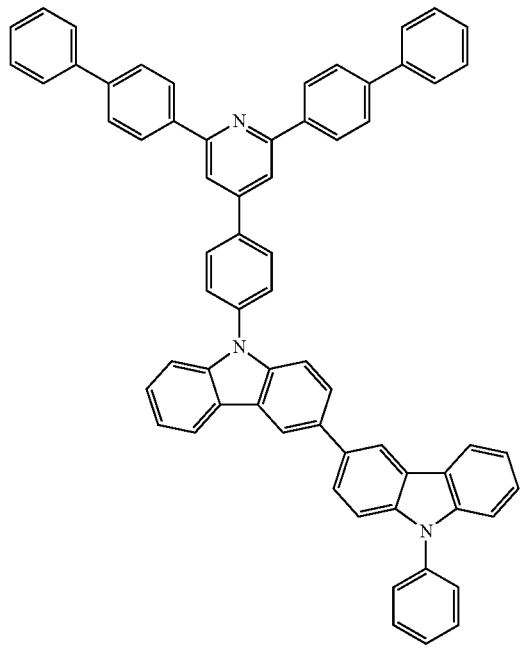
(A38)
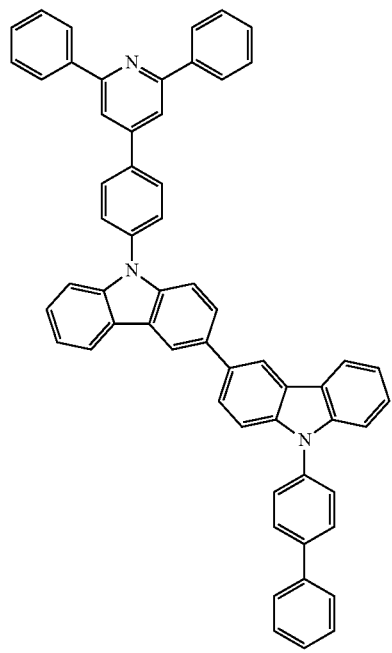
(A39)
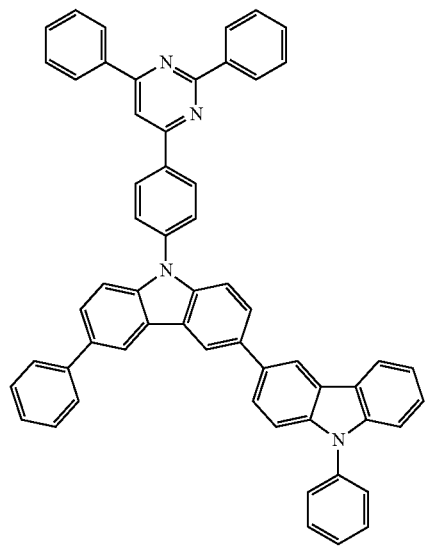
(A40)

-continued
(A41)
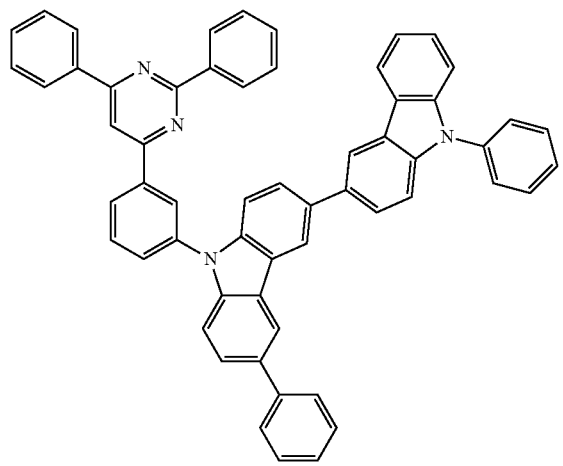
(A42)
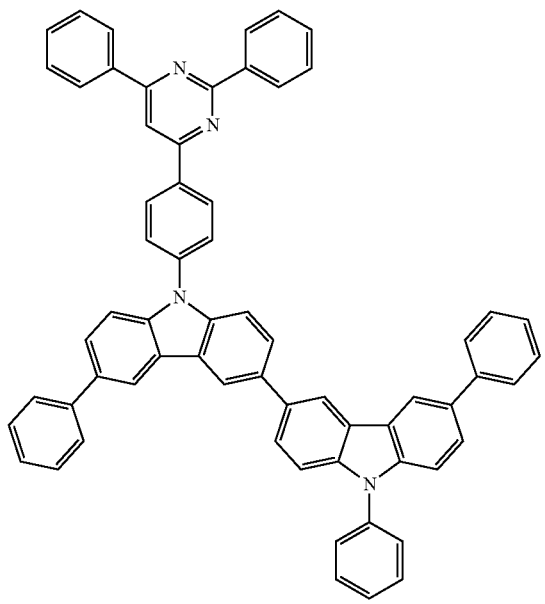
(A43)
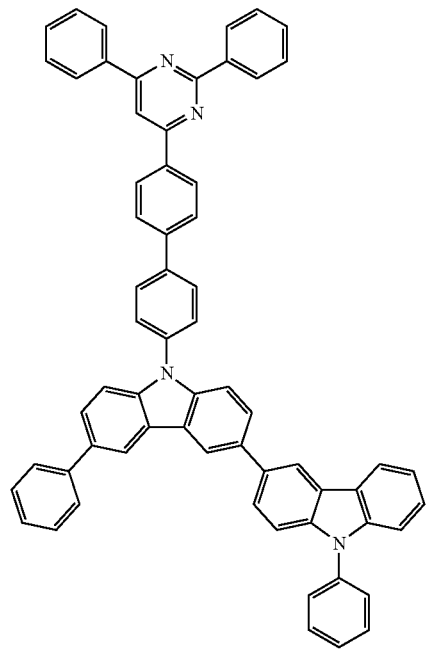
(A44)
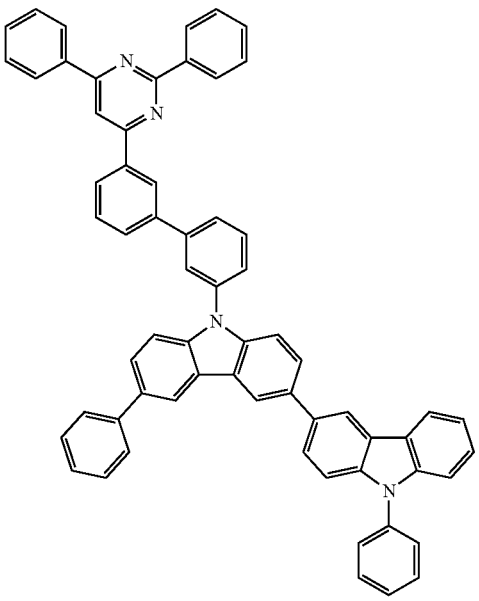

(A45)
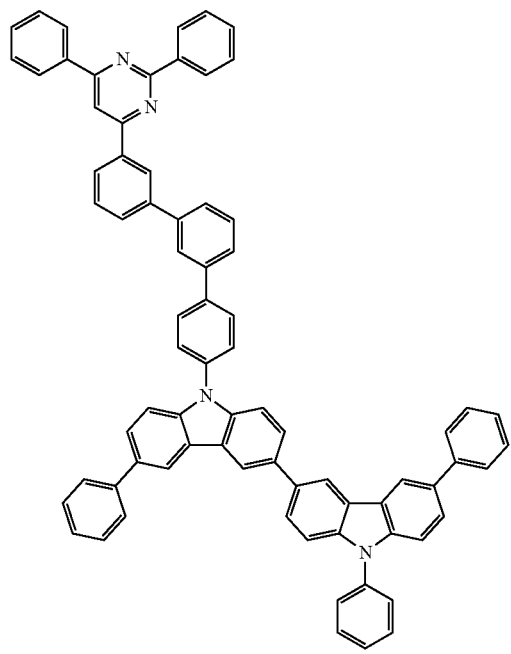
(A46)
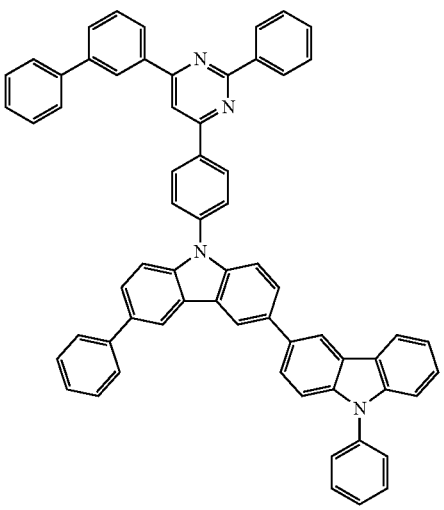
(A47)
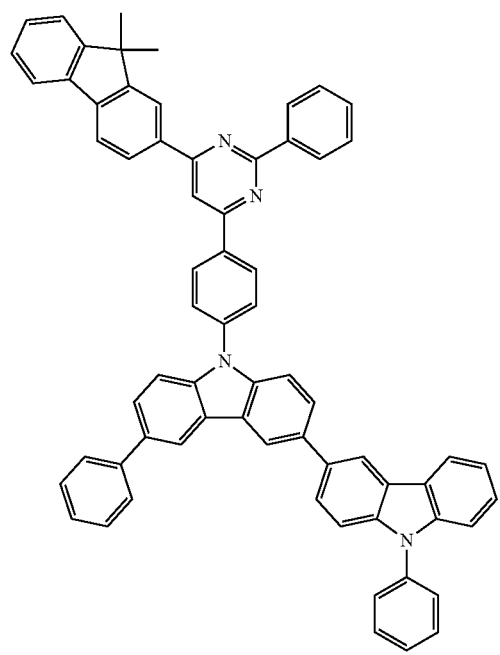
(A48)
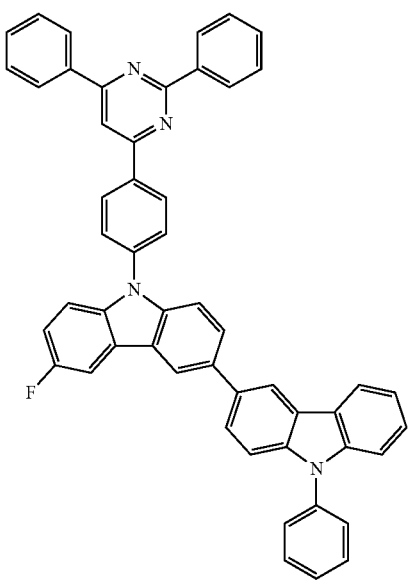

-continued
(A49)
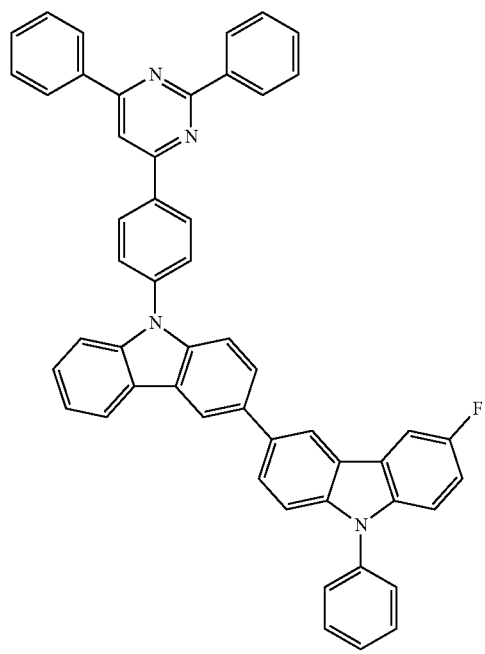
(A50)
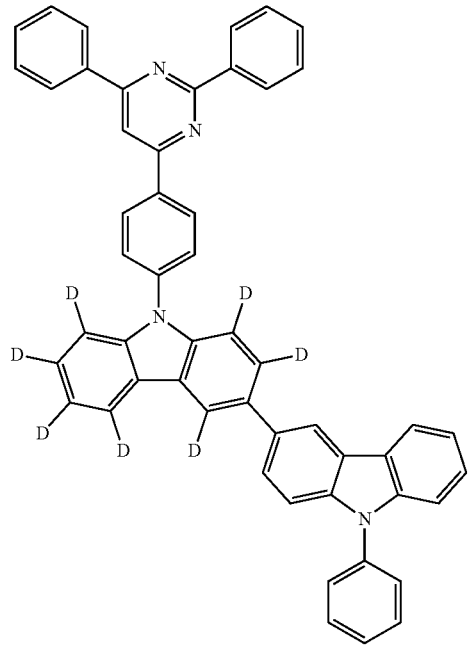
(A51)
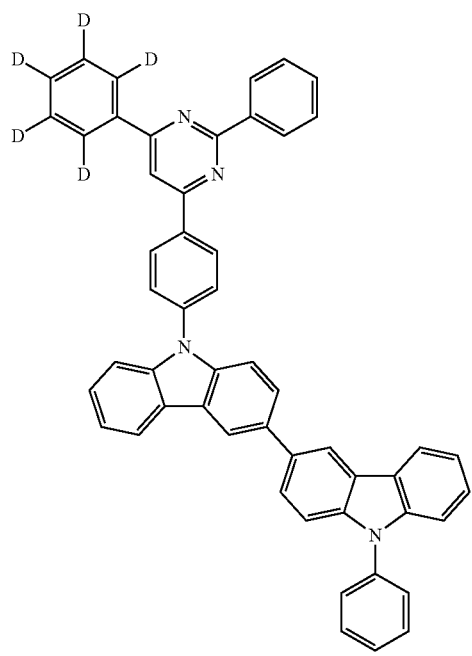
(A52)
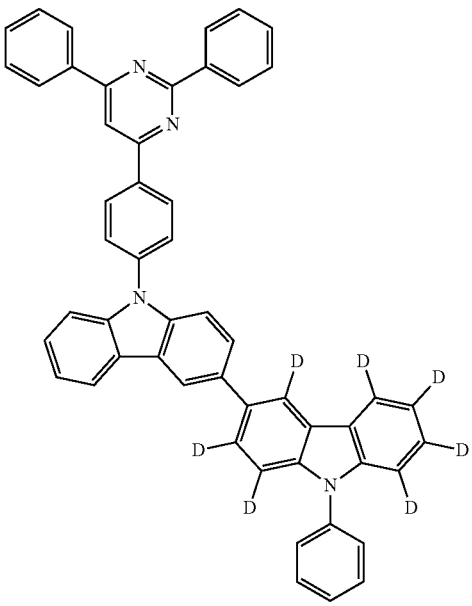

-continued
(A53)
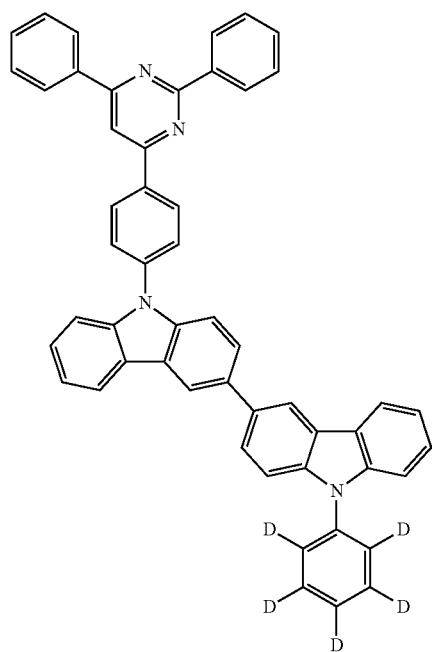
(A54)
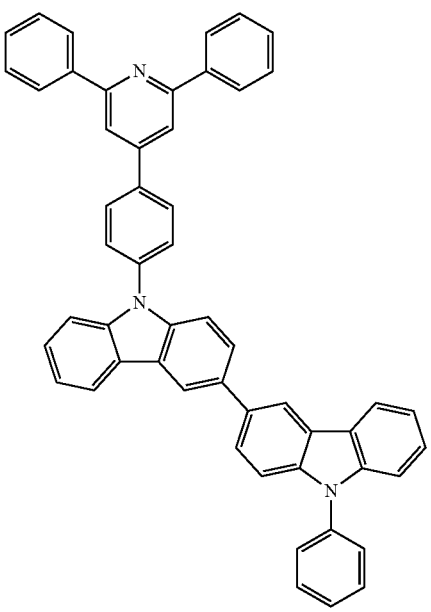
(A55)
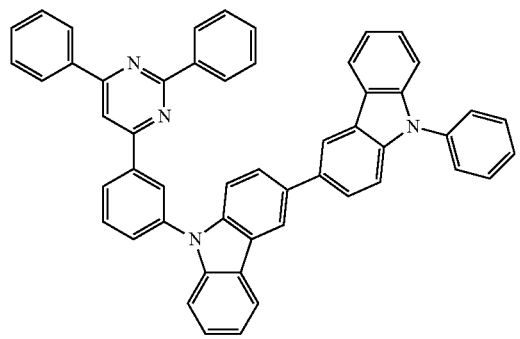
(A56)
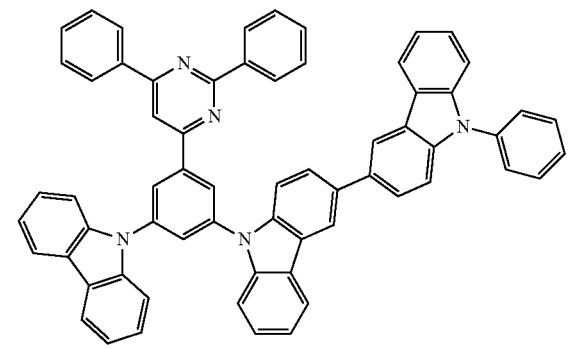
(A57)
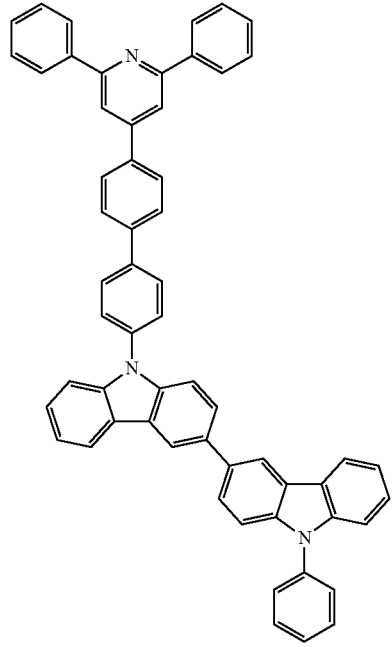
(A58)
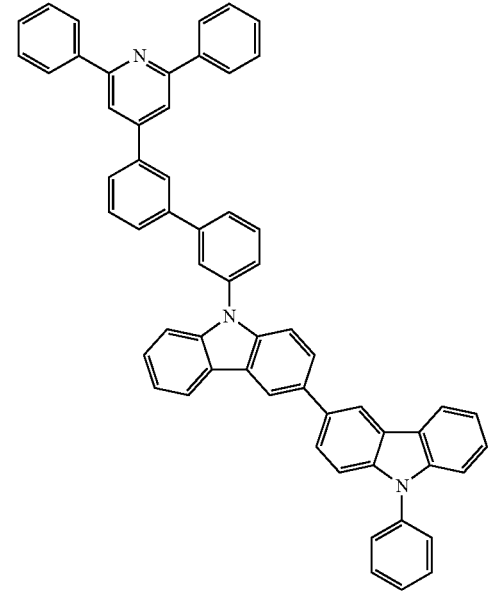

-continued
(A59)
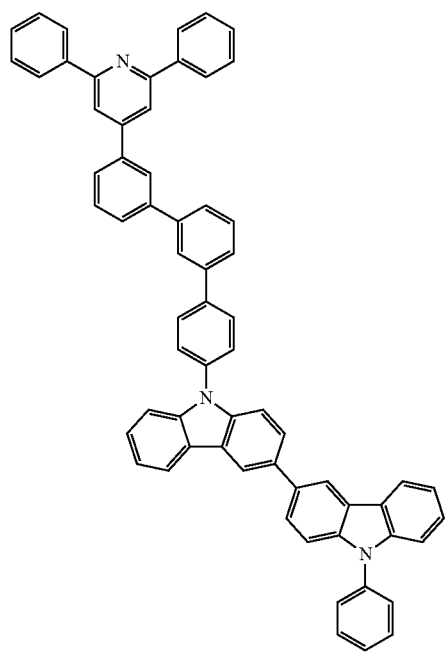
(A60)
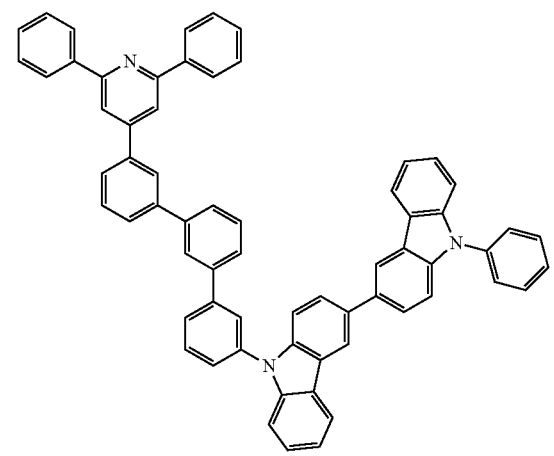
(A61)
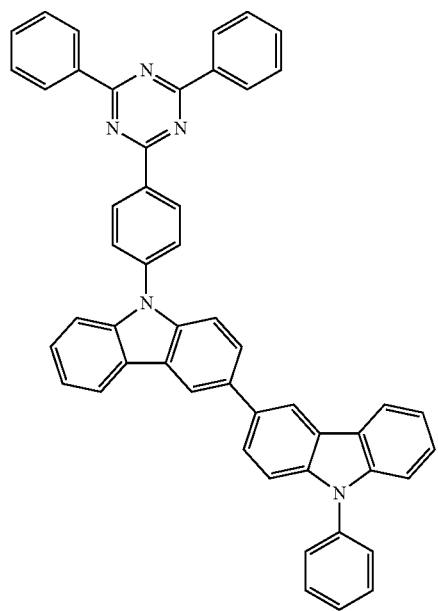
(A62)
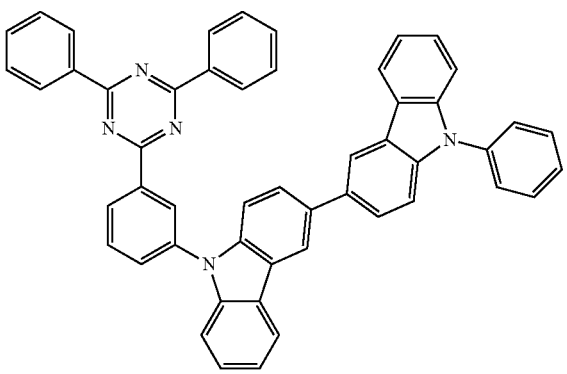

-continued
(A63)
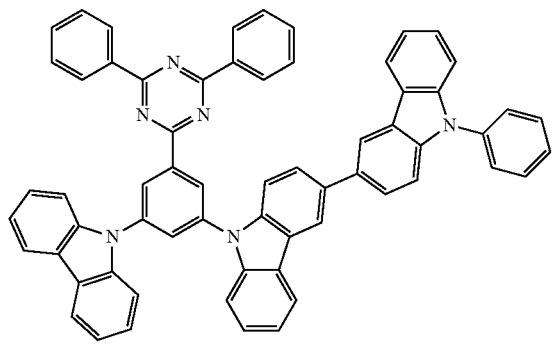
(A64)
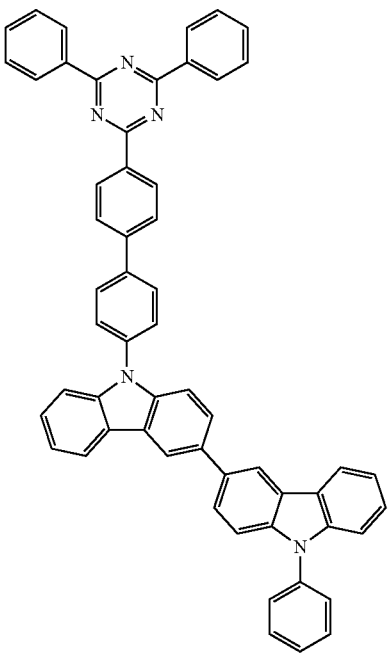
(A65)
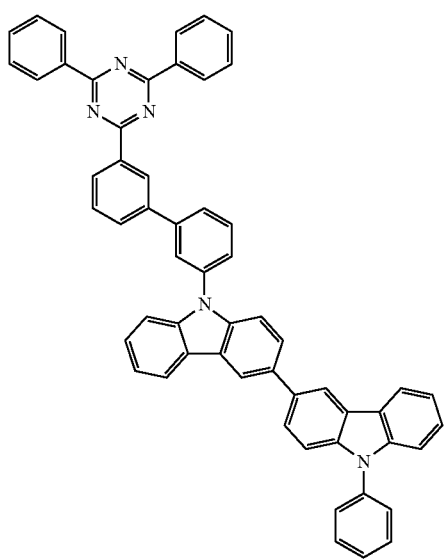
(A66)
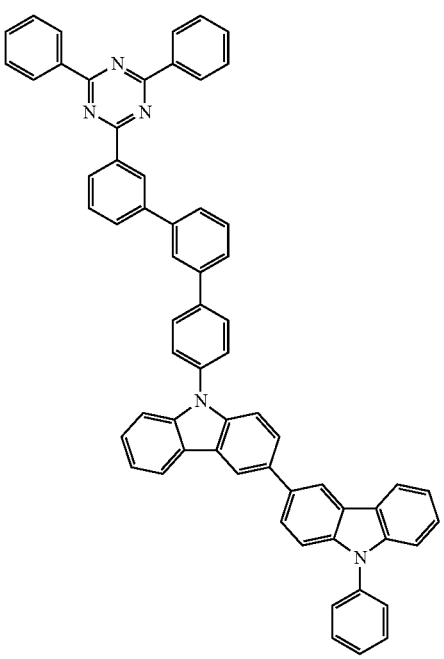

-continued
(A67)
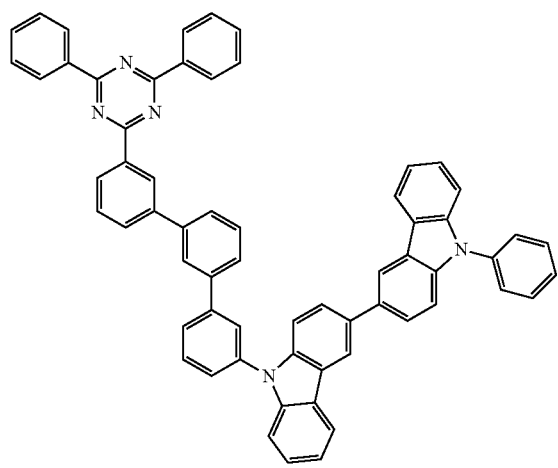
(A68)
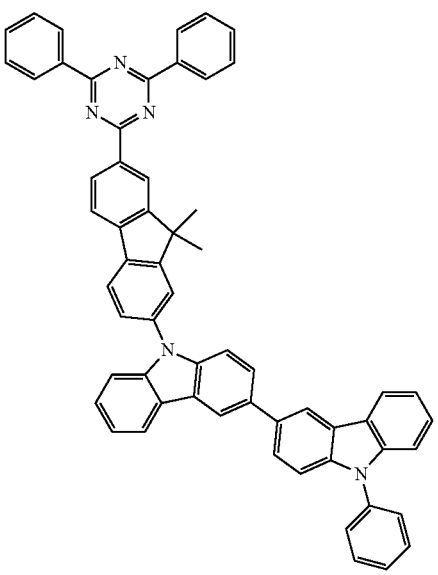
(A69)
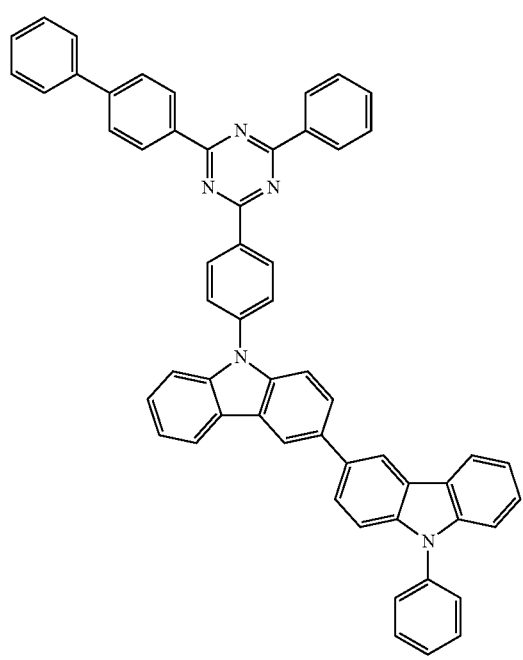
(A70)
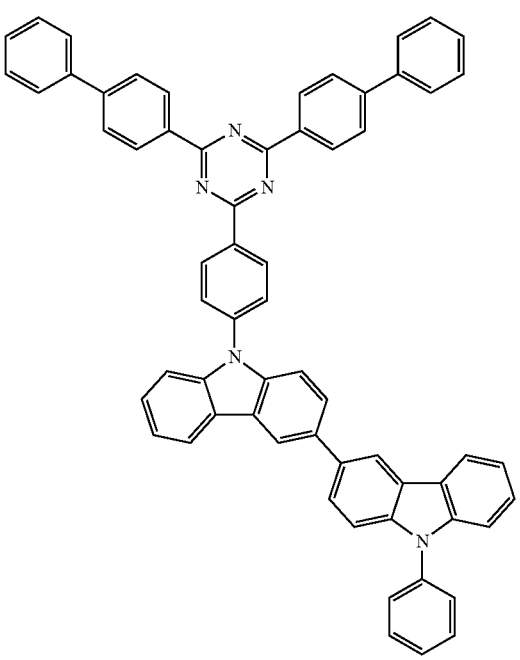

-continued
(A71)
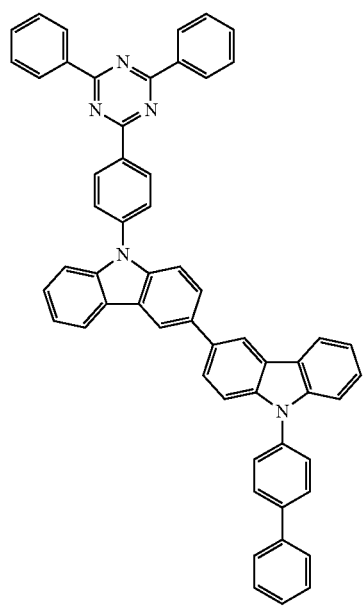
(A72)
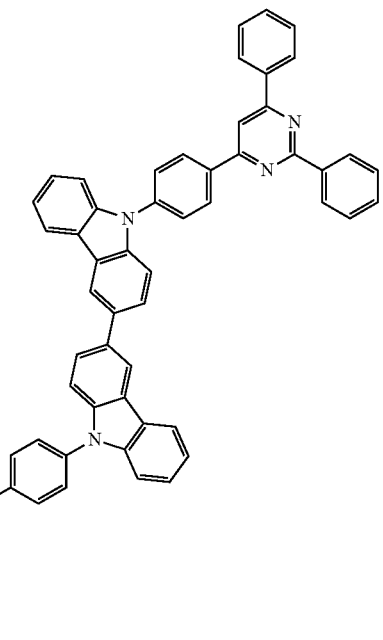
(A73)
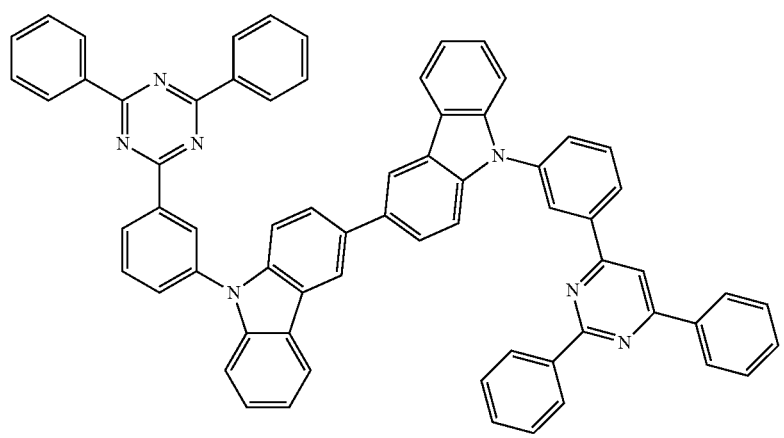
(A74)
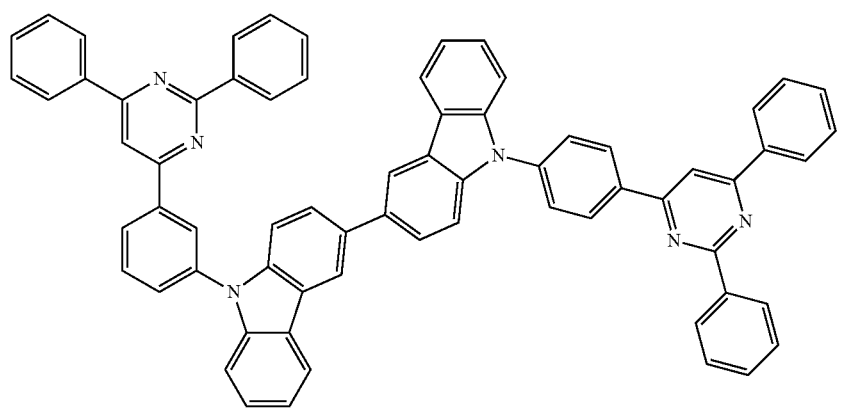

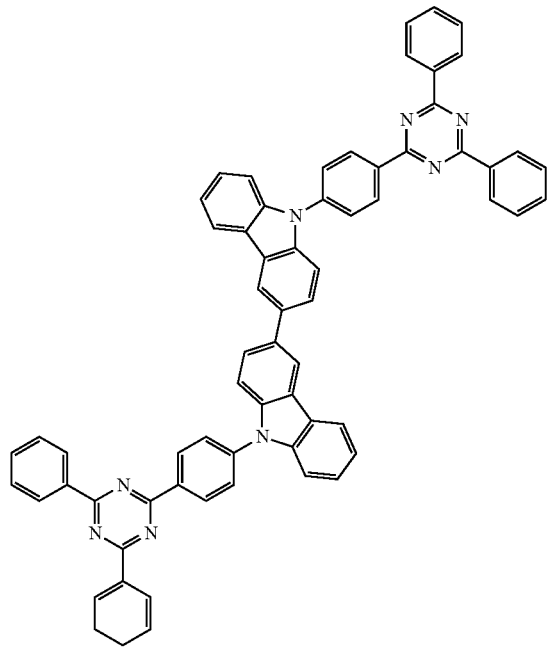
(A75)
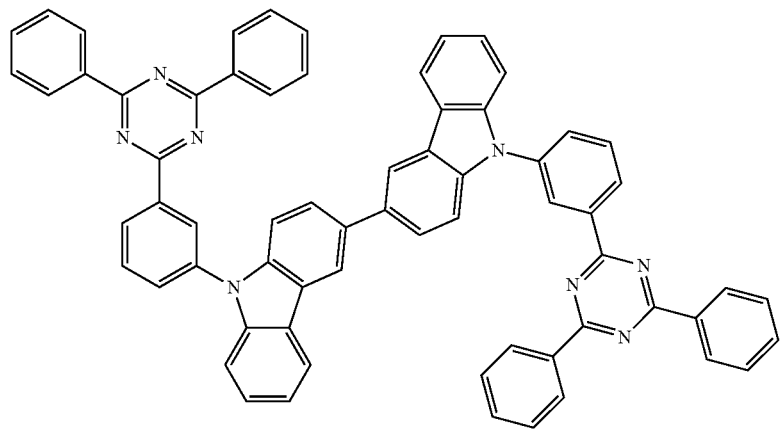
(A76)
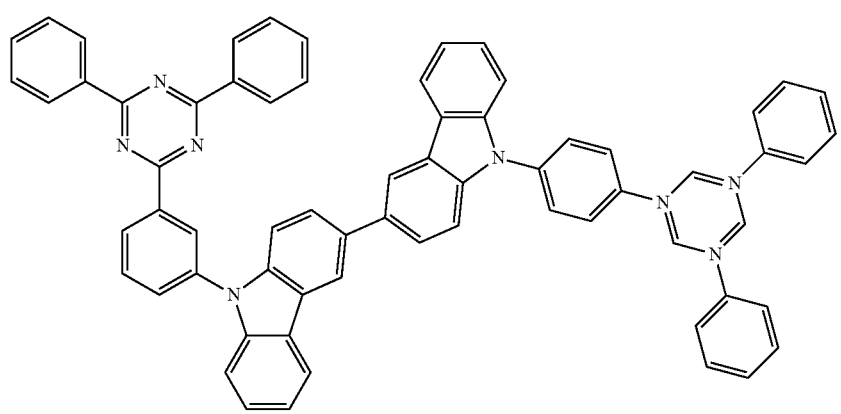
(A77)

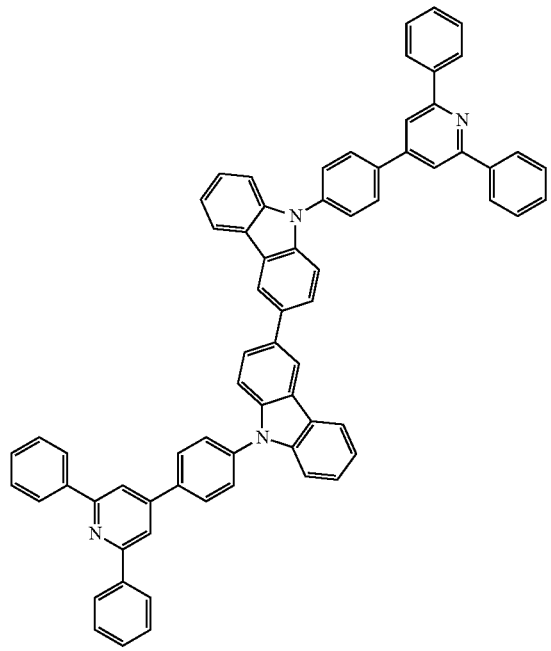
(A78)
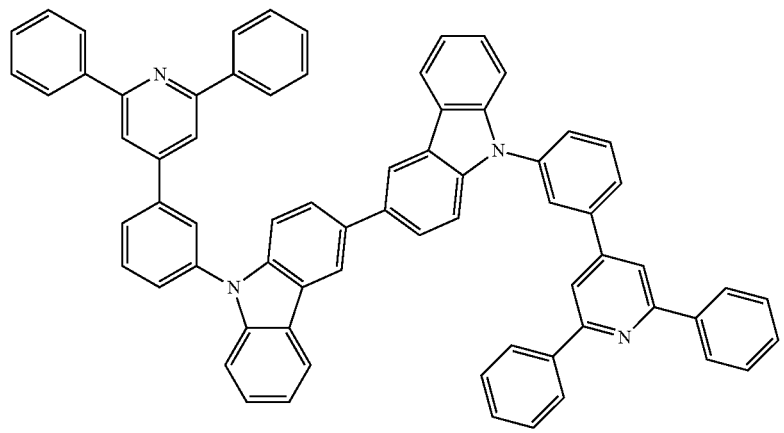
(A79)
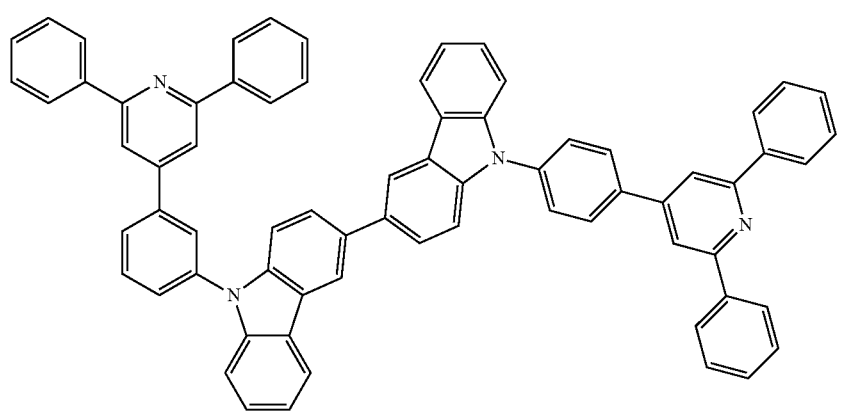
(A80)

-continued
(A81)
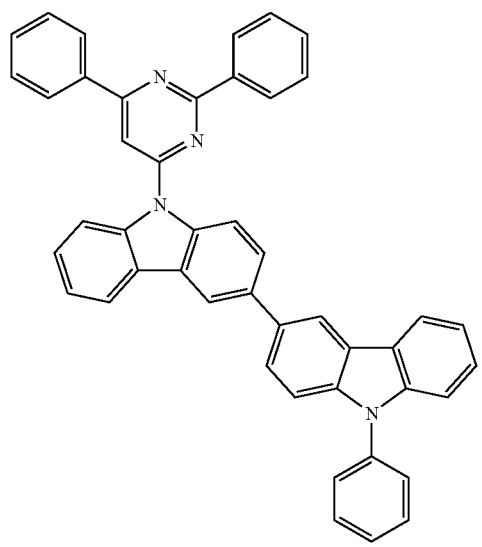
(A82)
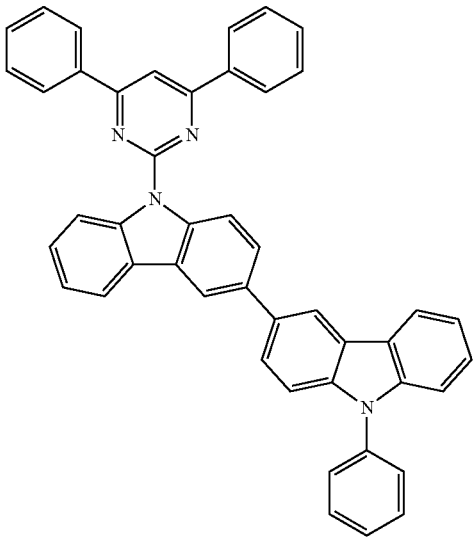
(A83)
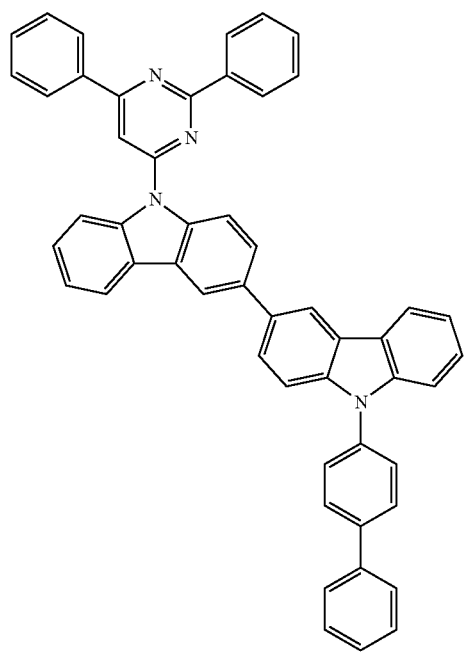
(A84)
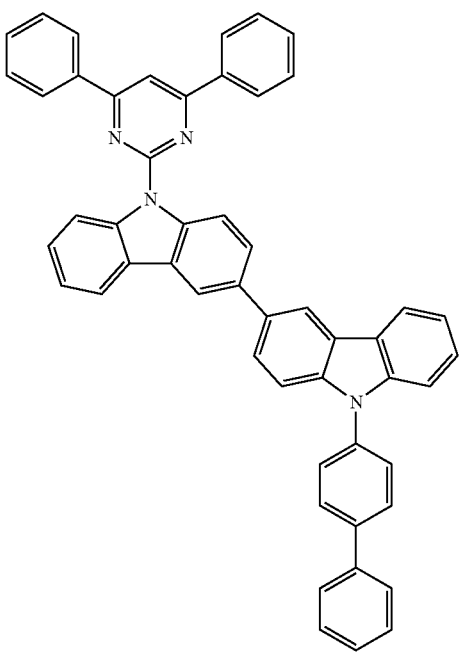

-continued
(A85)
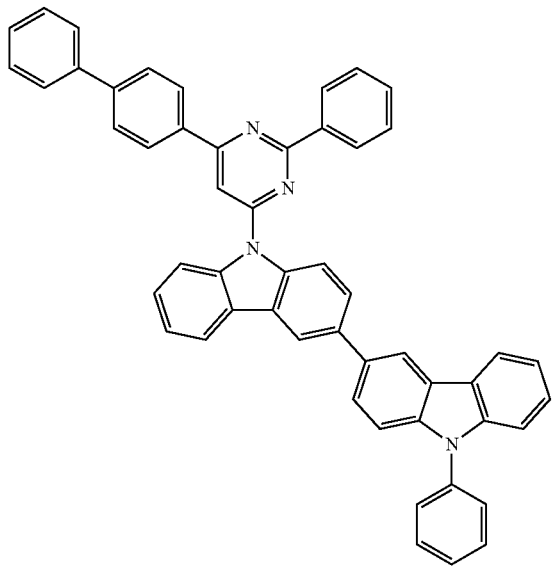
(A86)
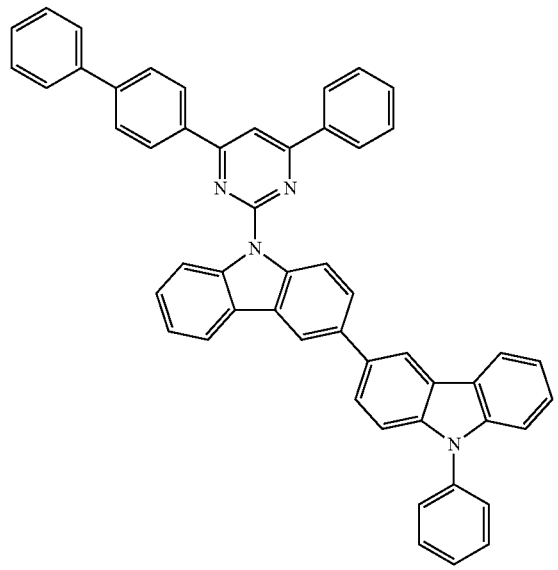
(A87)
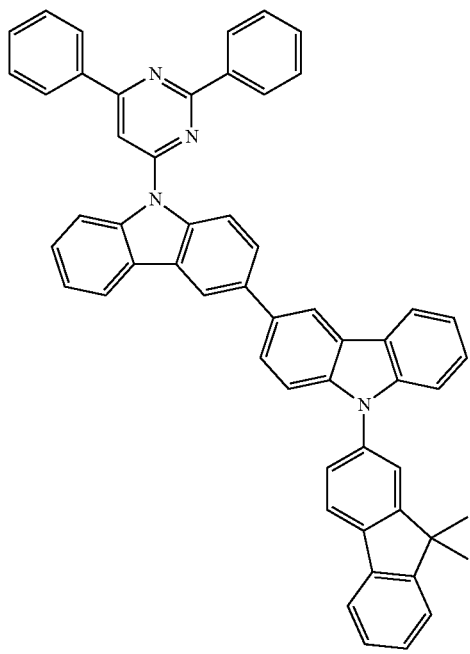
(A88)
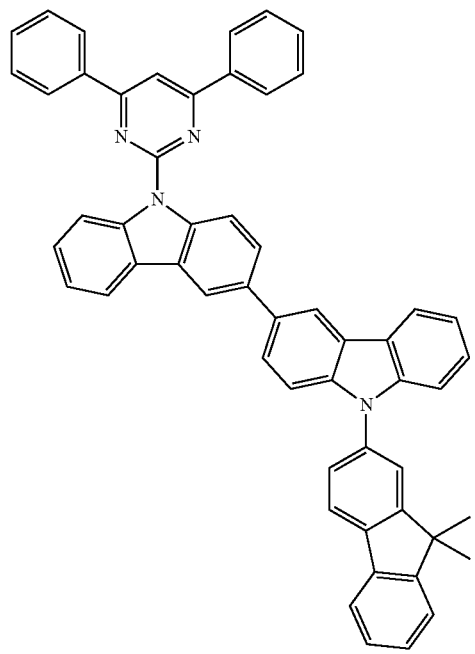

-continued
(A89) 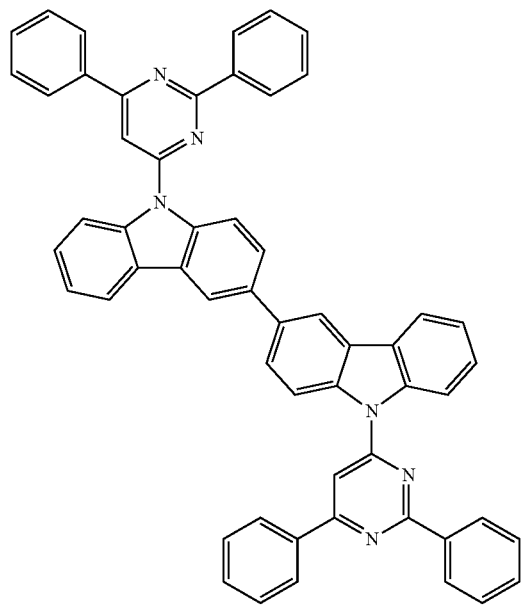
(A90) 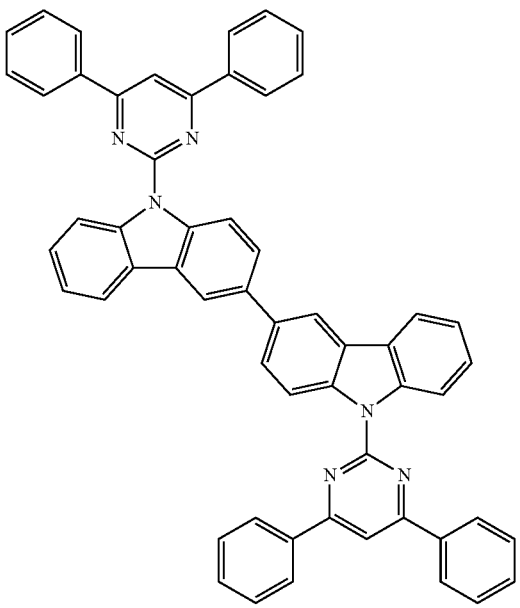
(A91) 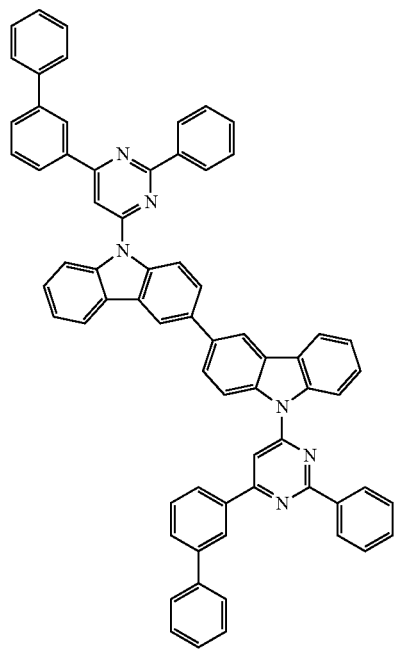
(A92) 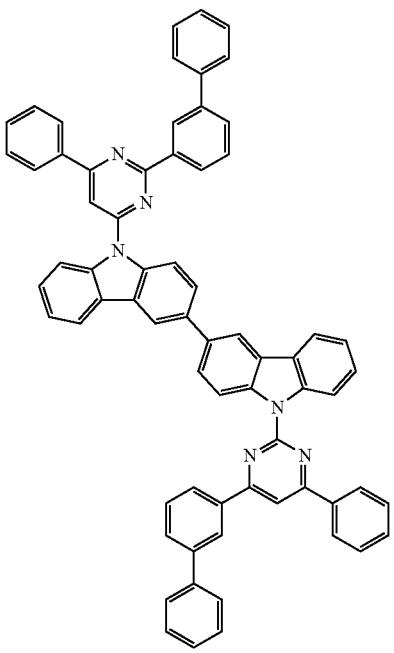
(A93) 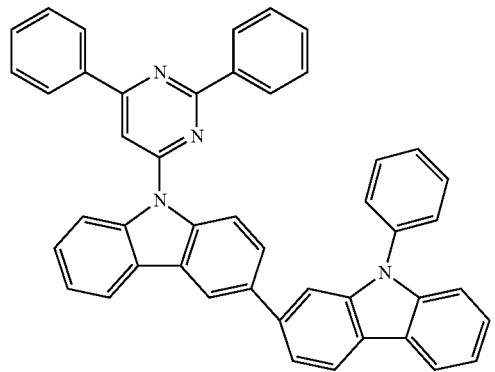
(A94) 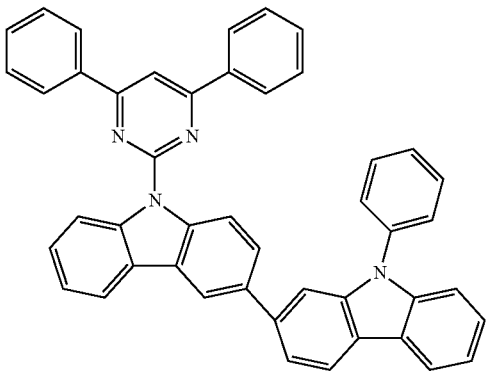

-continued
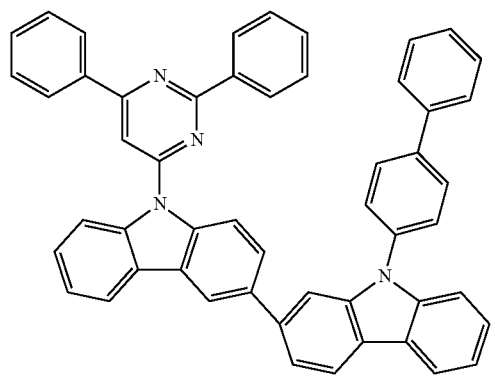
(A95)
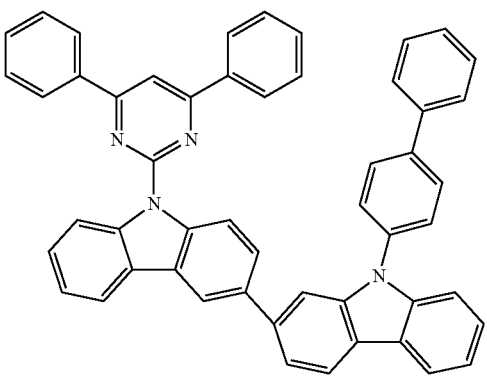
(A96)
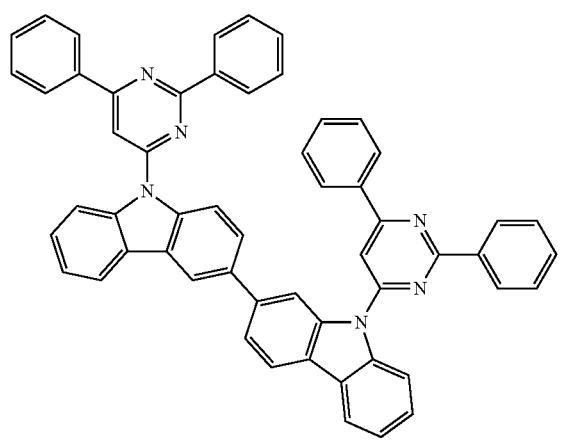
(A97)
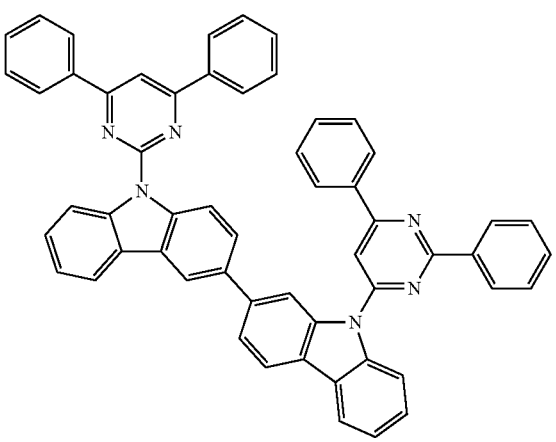
(A98)
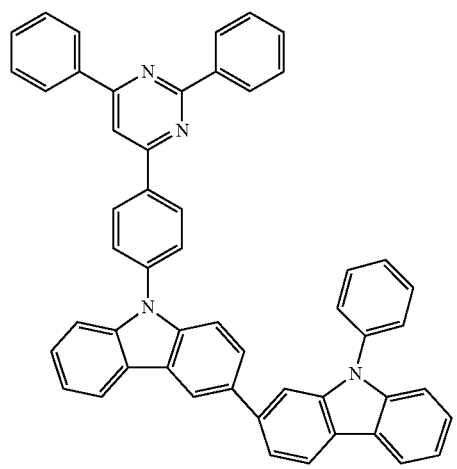
(A99)
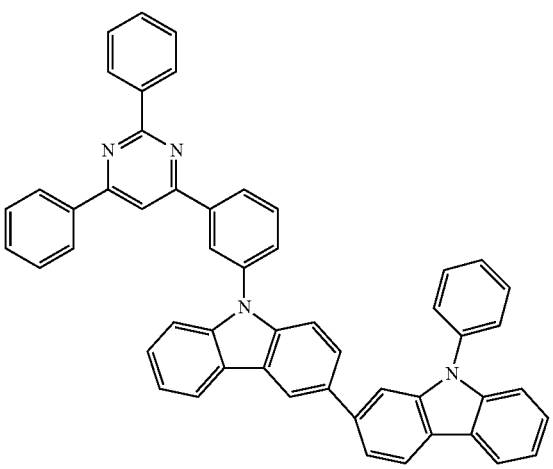
(A100)

-continued
(A101)
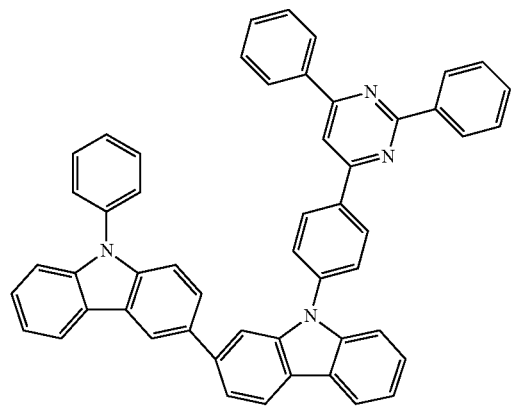
(A102)
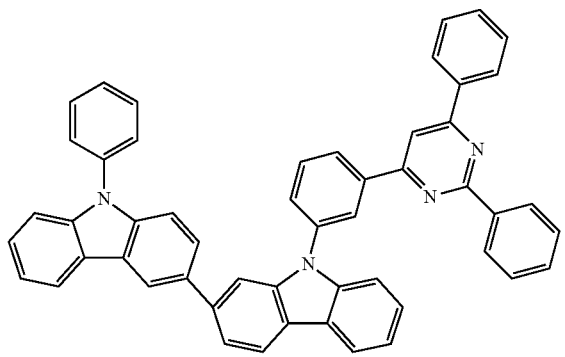
(A103)
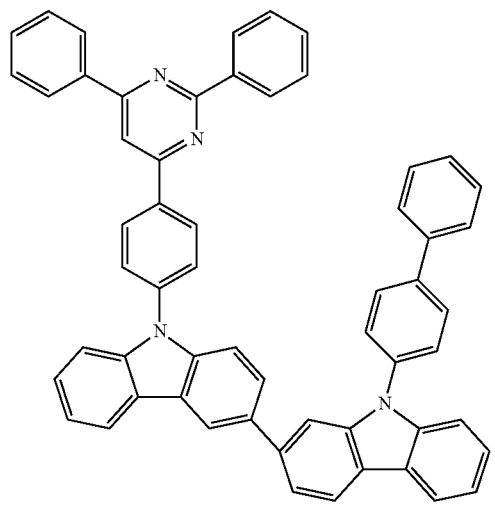
(A104)
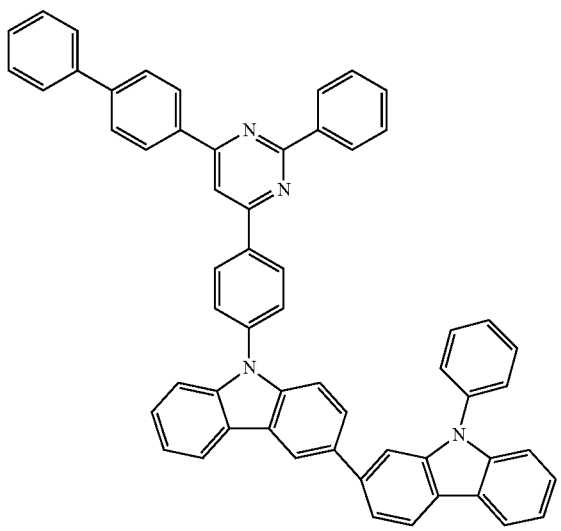
(A105)
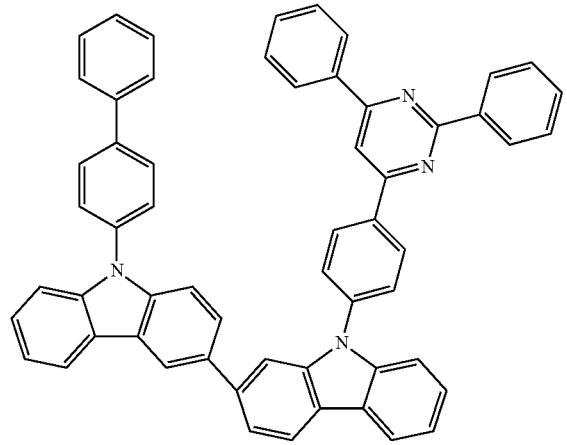
(A106)
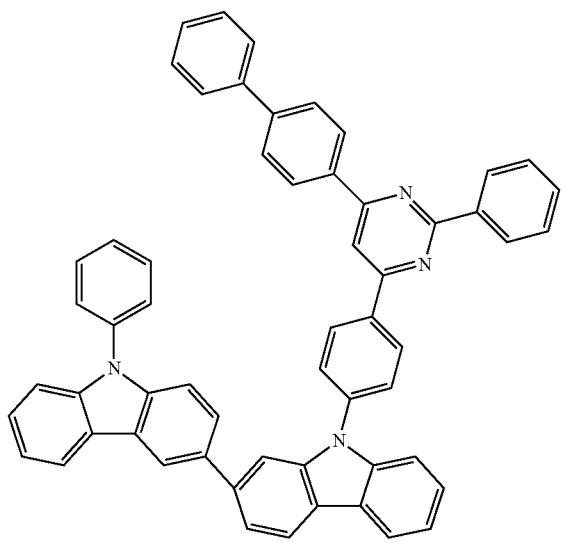

(A107)
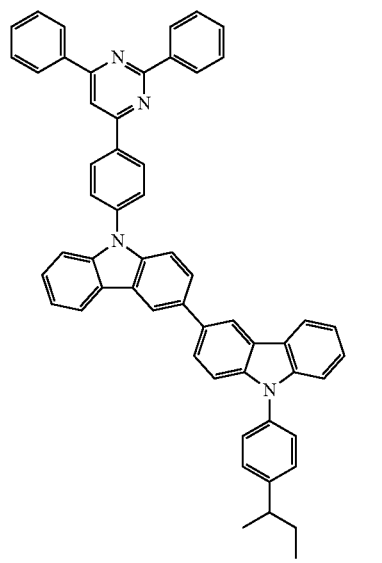
(A108)
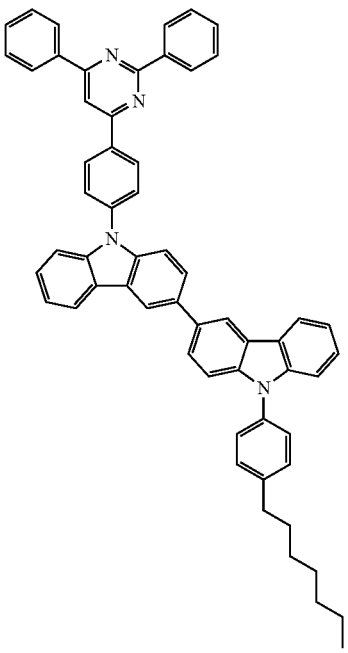
(A109)
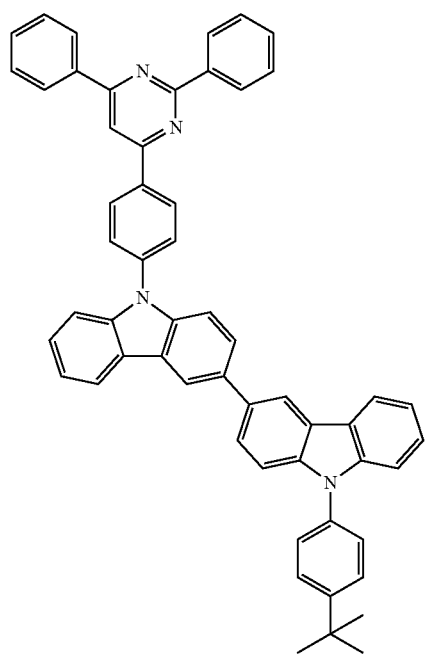
(A110)
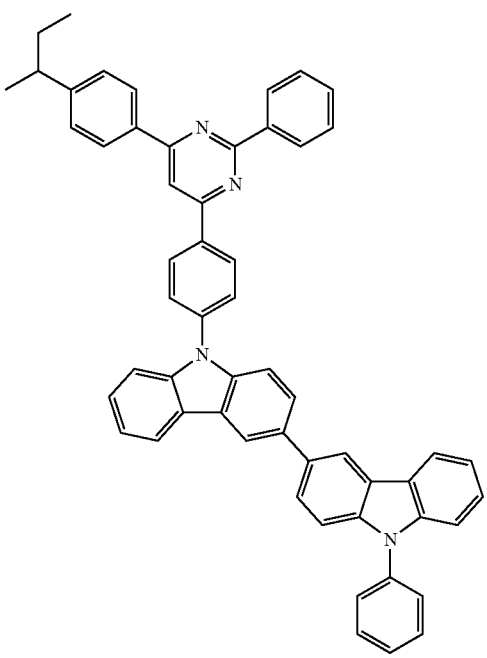

(A111)
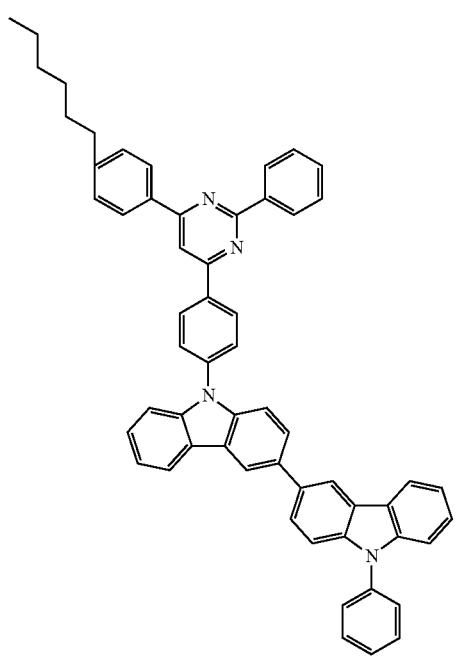
(A112)
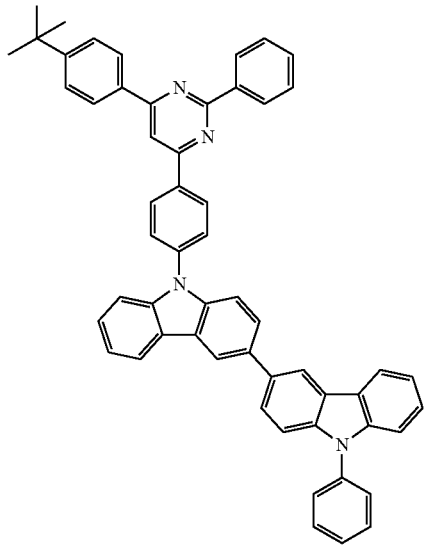
(A113)
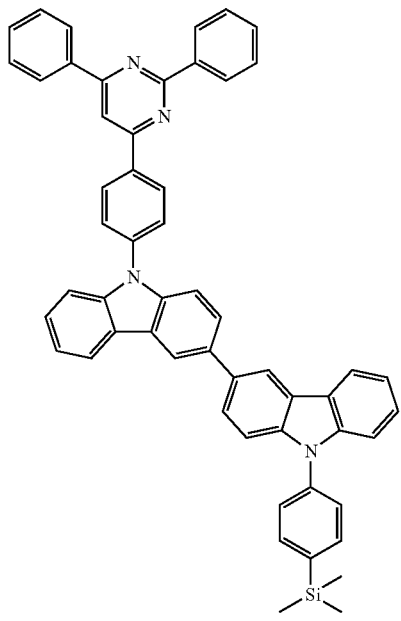
(A114)
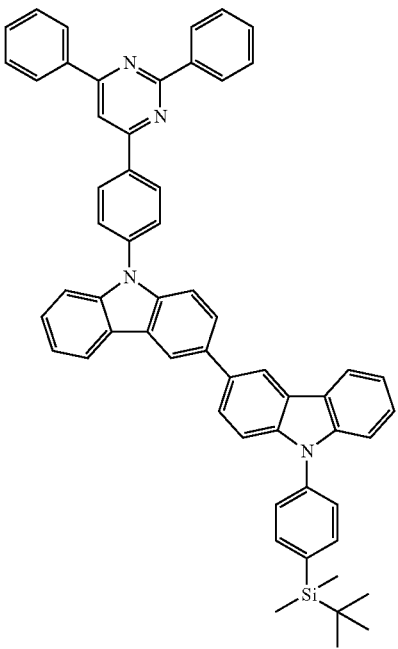

-continued
(A115)
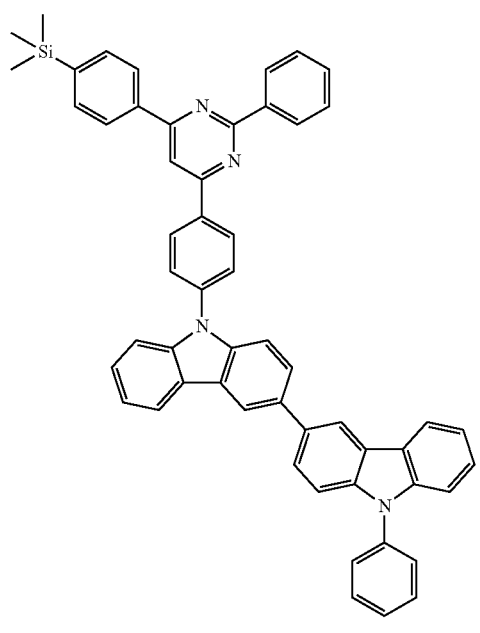
(A116)
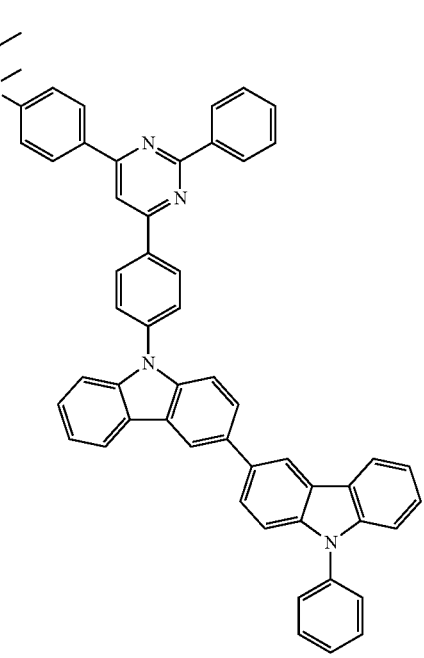
(A117)
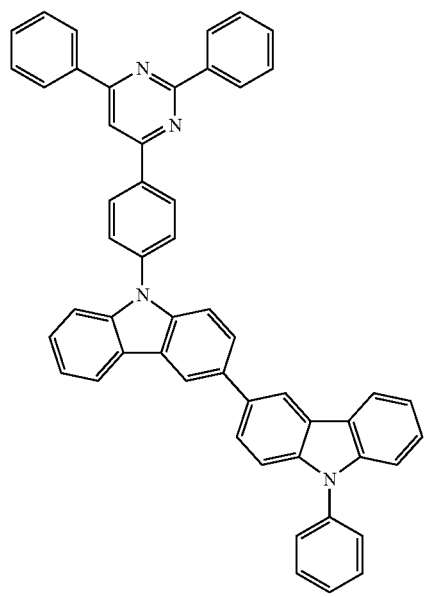
(A118)
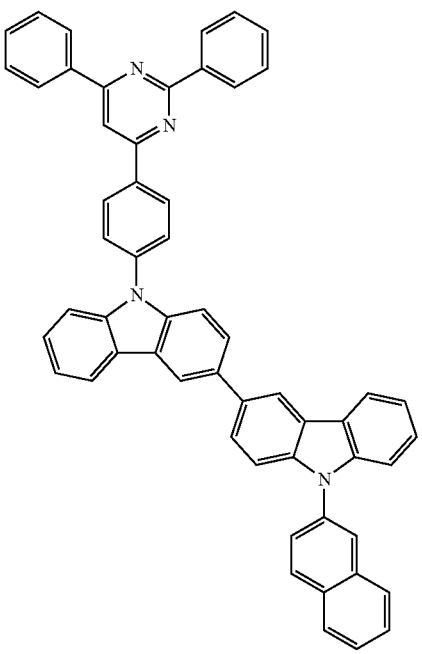

-continued
(A119)
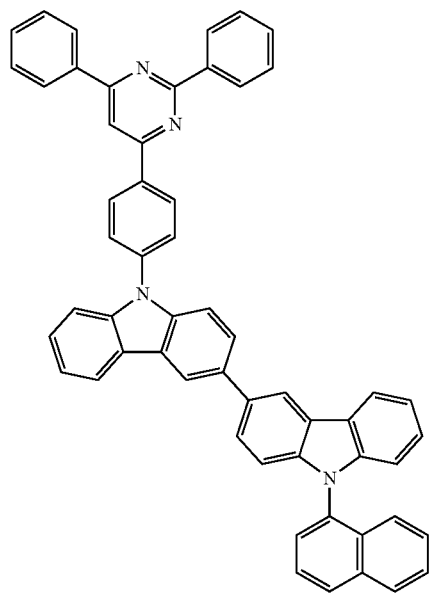
(A120)
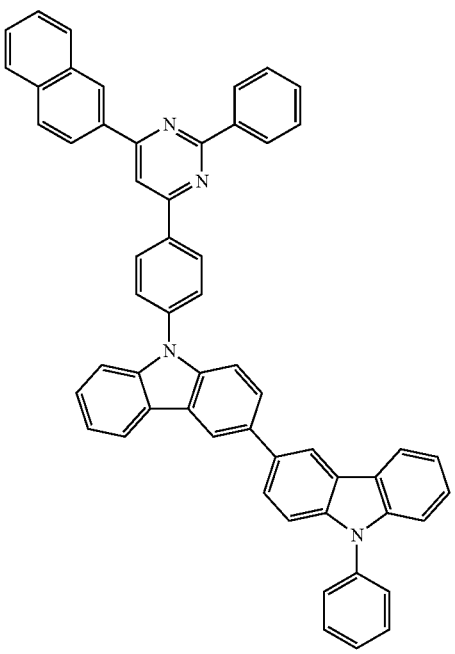
(A121)
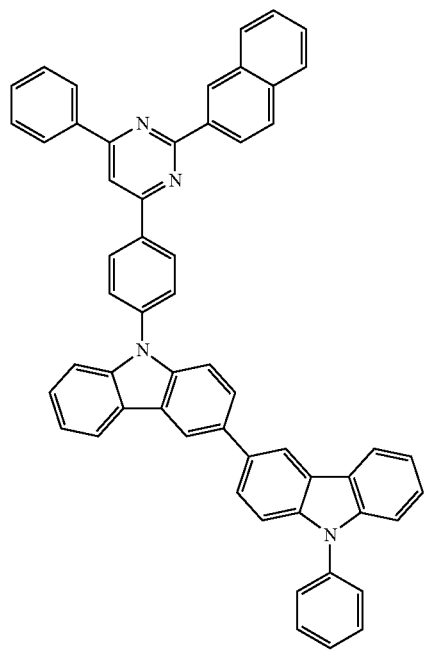
(A122)
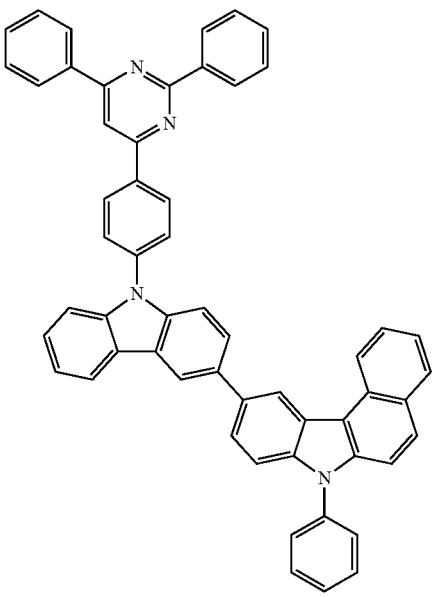

-continued
(A123)
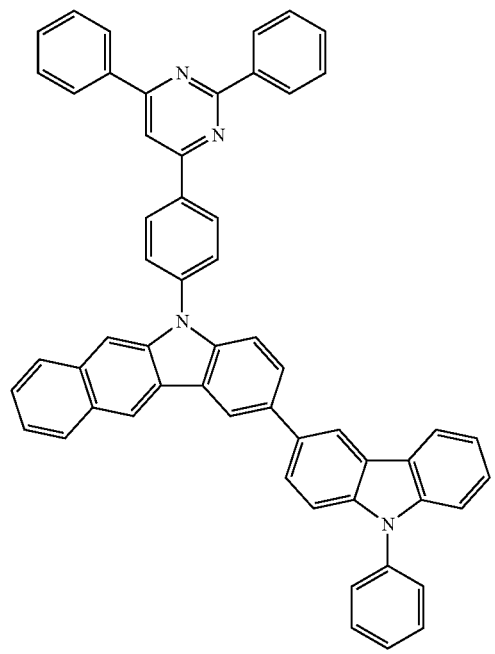
(A124)
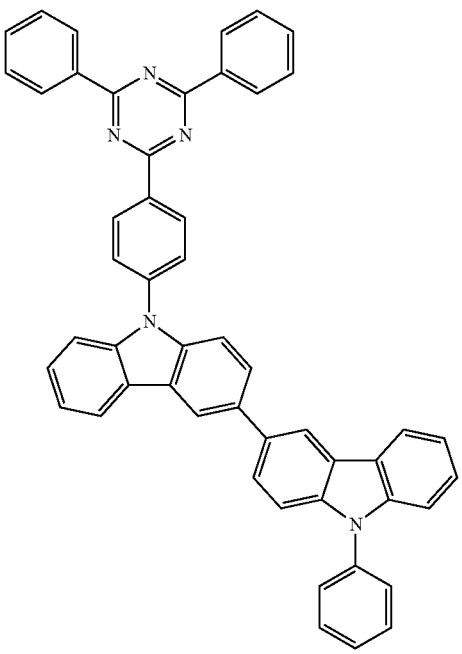
(A125)
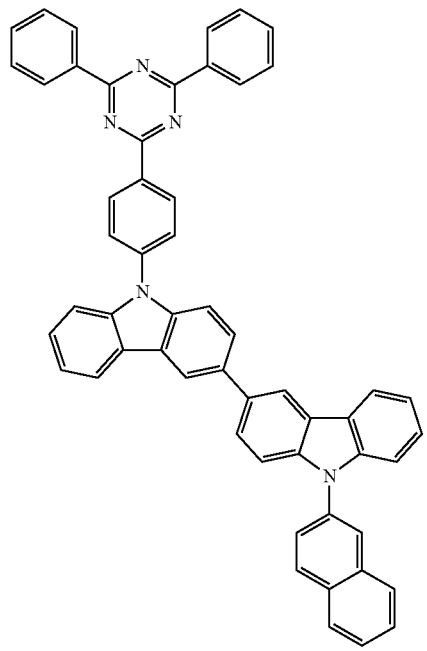
(A126)
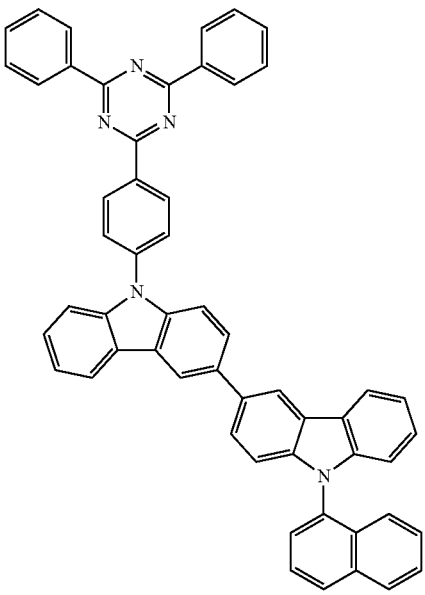

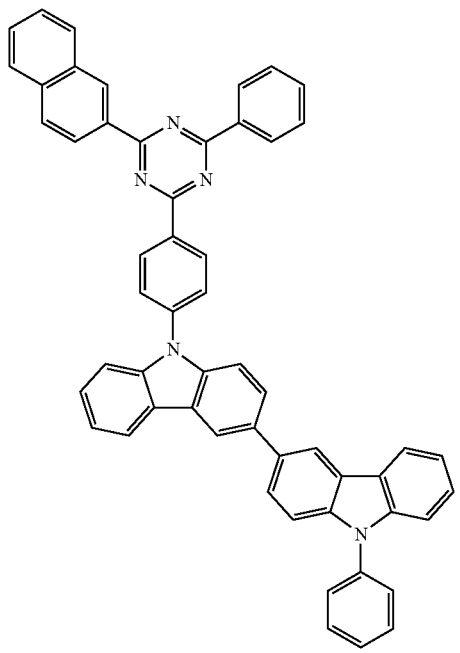

(A127)

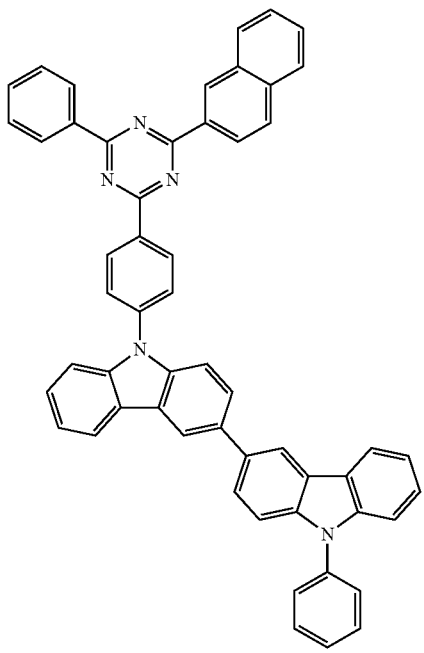

(A128)

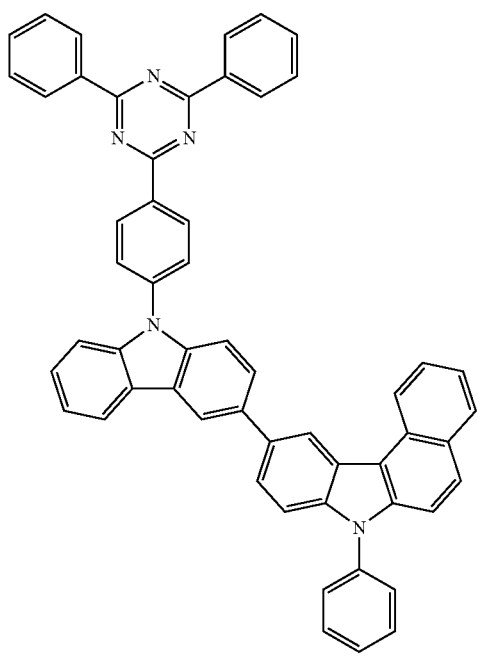

(A129)

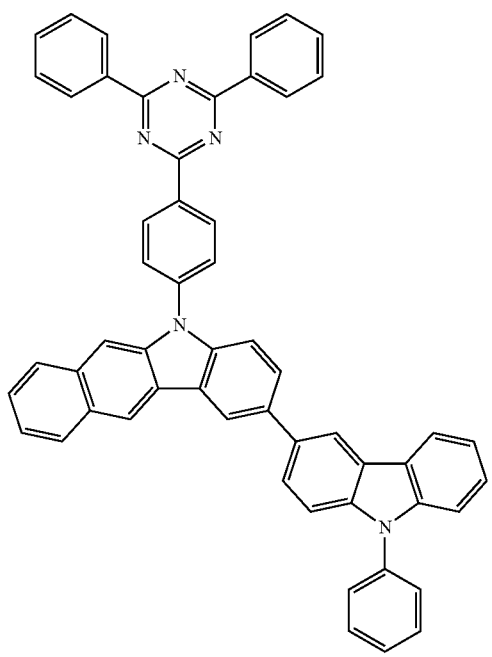

(A130)

With regard to phosphorescent emitter materials capable of use in the OLEDs of the present invention, Ir(2-phenylquinoline) and Ir(1-phenylisoquinoline) type phosphorescent materials have been synthesized, and OLEDs incorporating them as the dopant emitters have been fabricated. Such devices may advantageously exhibit high current efficiency, high stability, narrow emission, high processability (such as high solubility and low evaporation temperature), high luminous efficiency, and/or high luminous efficiency.

Using the base structure of Ir(3-Meppy)$_3$, different alkyl and fluoro substitution patterns have been studied to establish a structure-property relationship with respect to material processability (evaporation temperature, evaporation stability, solubility, etc.) and device characteristics of Ir(2-phenylquinoline) and Ir(1-phenylisoquinoline) type phosphorescent materials. Alkyl and fluoro substitutions are particularly important because they offer a wide range of tenability in terms of evaporation temperature, solubility, energy levels, device efficiency, etc. Moreover, they are stable as functional groups chemically and in device operation when applied appropriately.

In one embodiment of the present invention, the phosphorescent emitter material comprises a phosphorescent organometallic complex having a substituted chemical structure represented by one of the following partial chemical structures represented by the following Formula:

$LL'L''M$ wherein M is a metal that forms octahedral complexes, L, L', L'' are equivalent or inequivalent bidentate ligands wherein each L comprises a substituted or unsubstituted phenylpyridine ligand coordinated to M through an sp² hybridized carbon and N; and, one of L, L' and L'' is inequivalent to at least one of the other two.

In an embodiment, the phosphorescent emitter material comprises a phosphorescent organometallic compound having a substituted chemical structure represented by the following chemical structure:

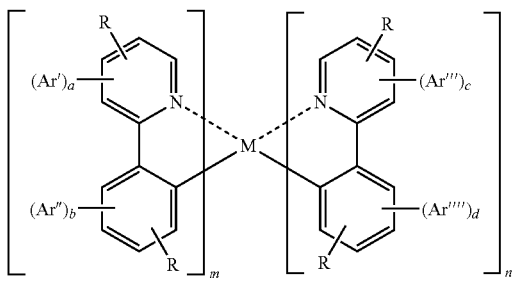

where each R is independently selected from the group consisting of H, alkyl, alkenyl, alkynyl, alkylaryl, CN, $CF_3$, $C_nF_{2n+1}$, trifluorovinyl, $CO_2R$, $C(O)R$, $NR_2$, $NO_2$, OR, halo, aryl, heteroaryl, substituted aryl, substituted heteroaryl or a heterocyclic group;

Ar', Ar'', Ar''' and Ar'''' each independently represent a substituted or unsubstituted aryl or heteroaryl unfused substituent on the phenylpyridine ligand;

a is 0 or 1; b is 0 or 1; c is 0 or 1; d is 0 or 1; m is 1 or 2; n is 1 or 2;

m+n is the maximum number of ligands that can be coordinated to M, and wherein at least one of a, b, c, and d is 1 and when at least one of a and b is 1 and at least one of b and c is 1, at least one of Ar' and Ar'' is different from at least one of Ar''' and Ar''''.

In another embodiment, the phosphorescent emitter material comprises a metal complex, and the metal complex comprises a metal atom selected from Ir, Pt, Os, Au, Cu, Re and Ru and a ligand. In yet another embodiment the metal complex has an ortho-metal bond. The metal atom is preferably Ir.

In a preferred embodiment, the phosphorescent emitter material comprises a phosphorescent organometallic complex having a substituted chemical structure represented by the following partial chemical structure (GD-1):

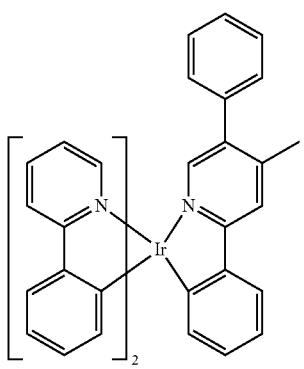

(GD-1)

In a preferred embodiment, the present invention relates to an OLED wherein the host material comprises an unsubstituted aromatic hydrocarbon compound having the chemical structure represented by the formula (GH-1):

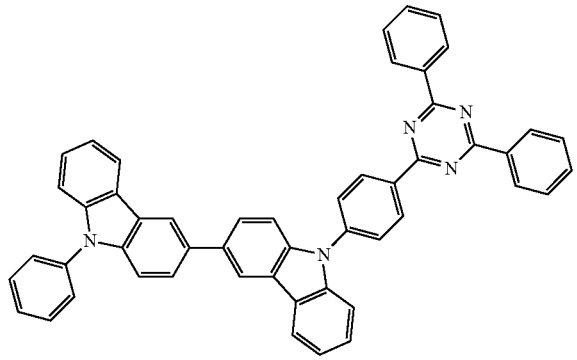

(GH-1)

and wherein the phosphorescent emitter material comprises a phosphorescent organometallic compound having a substituted chemical structure represented by the following chemical structure (2):

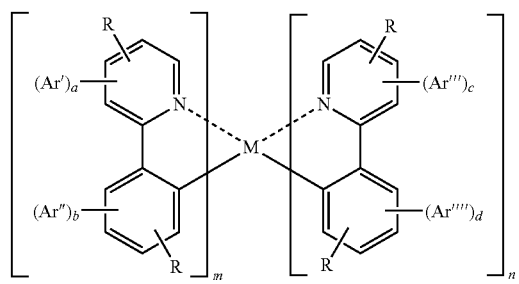

(2)

where each R is independently selected from the group consisting of H, alkyl, alkenyl, alkynyl, alkylaryl, CN, $CF_3$, $C_nF_{2n+1}$, trifluorovinyl, $CO_2R$, $C(O)R$, $NR_2$, $NO_2$, OR, halo, aryl, heteroaryl, substituted aryl, substituted heteroaryl or a heterocyclic group;

Ar', Ar'', Ar''' and Ar'''' each independently represent a substituted or unsubstituted aryl or heteroaryl unfused substituent on the phenylpyridine ligand; a is 0 or 1; b is 0 or 1; c is 0 or 1; d is 0 or 1; m is 1 or 2; n is 1 or 2;

m+n is the maximum number of ligands that can be coordinated to M, and wherein at least one of a, b, c, and d is 1 and when at least one of a and b is 1 and at least one of b and c is 1, at least one of Ar' and Ar'' is different from at least one of Ar''' and Ar''''.

The OLEDs of the present invention may comprise a hole transporting layer (hole injecting layer), and the above hole transporting layer (hole injecting layer) preferably contains the materials of the present invention. Also, the OLEDs of the present invention may comprise an electron transporting layer and/or a hole blocking layer, and the above electron transporting layer and/or hole blocking layer preferably contains the materials of the present invention.

The OLEDs of the present invention may contain a reductant dopant in an interlayer region between the cathode and the organic thin film layer. Such an OLED having the described structural constitution, may exhibit improved emission luminance and extended lifetime.

The reductant dopant includes at least one dopant selected from alkali metals, alkali metal complexes, alkali metal compounds, alkali earth metals, alkali earth metal complexes, alkali earth metal compounds, rare earth metals, rare earth metal complexes, rare earth metal compounds and the like.

Suitable alkali metals include Na (work function: 2.36 eV), K (work function: 2.28 eV), Rb (work function: 2.16 eV), Cs (work function: 1.95 eV) and the like, and the compounds having a work function of 2.9 eV or less are particularly preferred. Among them, K, Rb and Cs are preferred, more preferred are Rb or Cs, and even more preferred is Cs.

The alkali earth metals include Ca (work function: 2.9 eV), Sr (work function: 2.0 to 2.5 eV), Ba (work function: 2.52 eV) and the like, and the compounds having a work function of 2.9 eV or less are particularly preferred.

The rare earth metals include Sc, Y, Ce, Tb, Yb and the like, and the compounds having a work function of 2.9 eV or less are particularly preferred.

Among the metals described above, it is preferred to select metals having a high reducing ability, and addition of a relatively small amount thereof to the electron injecting region may make it possible to enhance the emission luminance and extend the lifetime of the OLED.

The alkali metal compounds include alkali metal oxides such as $Li_2O$, $Cs_2O$, $K_2O$ and the like and alkali metal halides such as LiF, NaF, CsF, KF and the like. Preferred compounds include LiF, $Li_2O$ and NaF.

The alkali earth metal compounds include BaO, SrO, CaO and $Ba_xSr_{1-x}O$ (0<x<1), $Ba_xCa_{1-x}O$ (0<x<1) and the like which are obtained by mixing the above compounds, and BaO, SrO and CaO are preferred.

The rare earth metals compound include $YbF_3$, $ScF_3$, $ScO_3$, $Y_2O_3$, $Ce_2O_3$, $GdF_3$, $TbF_3$ and the like, and $YbF_3$, $ScF_3$ and $TbF_3$ are preferred.

The alkali metal complex, the alkali earth metal complex and the rare earth metal complex shall not specifically be restricted as long as they contain at least one metal ion of alkali metal ions, alkali earth metal ions and rare earth metal ions. The ligand is preferably quinolinol, benzoquinolinol, acridinol, phenanthridinol, hydroxyphenyloxazole, hydroxyphenylthiazole, hydroxydiaryloxadiazole, hydroxydiarylthiadiazole, hydroxyphenylpyridine, hydroxyphenylbenzimidazole, hydroxybenzotriazole, hydroxyfulvorane, bipyridyl, phenanthroline, phthalocyanine, porphyrin, cyclopentadiene, β-diketones, azomethines and derivatives thereof. However, suitable materials are not restricted to the above-mentioned compounds.

The reductant dopant may be formed in an interfacial region, and is preferably in a layer form or an island form. The forming method may be a method in which a light emitting material forming an interfacial region and an organic substance corresponding to an electron injecting material are deposited at the same time while depositing the reductant dopant by a resistance heating vapor deposition method to thereby disperse the reductant dopant in the organic substance. The dispersion concentration has a ratio of organic substance to reductant dopant of from about 100:1 to 1:100, and preferably from about 5:1 to 1:5 in terms of the mole ratio.

When the reductant dopant is formed in a layer form, the light emitting material which is an organic layer in an interfacial region and the electron injecting material are formed in a layer form, and then the reductant dopant may be deposited alone by the resistance heating vapor deposition method to form the layer, preferably in a thickness of 0.1 to 15 nm.

When the reductant dopant is formed in an island form, the light emitting material which is an organic layer in an interfacial region and the electron injecting material are formed in an island form, and then the reductant dopant may be deposited alone by the resistance heating vapor deposition light emitting method to form the island preferably in a thickness of 0.05 to 1 nm.

A mole ratio of the main component to the reductant dopant in the OLEDs of the present invention is preferably main component:reductant dopant=5:1 to 1:5, more preferably 2:1 to 1:2 in terms of a mole ratio.

The OLEDs of the present invention preferably have an electron injecting layer between the light emitting layer and the cathode. In this regard, the electron injecting layer may be a layer which functions as an electron transporting layer. The electron injecting layer or the electron transporting layer is a layer for assisting injection of an electron into the light emitting layer, and it has a large electron mobility. The electron injecting layer is provided to control an energy level including relaxation of a sudden change in the energy level.

The forming methods of the respective layers in the OLEDs of the present invention shall not specifically be restricted, and forming methods carried out by a vacuum vapor deposition method, a spin coating method and the like which have so far publicly been known can be used. The organic thin film layer containing the host material compounds represented by the formula (GH-1) described above which is used for the OLEDs of the present invention can be formed by known methods such as by vacuum vapor deposition, molecular beam evaporation (MBE method), and coating methods such as dipping, spin coating, casting, bar coating and roll coating, each using a solution prepared by dissolving the compound in a solvent.

The film thicknesses of the respective organic layers in the OLEDs of the present invention shall not specifically be restricted. In general, too small film thicknesses may be associated with defects such as pinholes and the like, while too large film thicknesses require application of high voltage, and may lower the OLED's efficiency. Accordingly, film thicknesses are typically in the range of one to several nm to 1 μm.

By the combination of the present invention, the triplet energy level of the phosphorescent dopant and the triplet energy level of the host are properly regulated. As a result thereof, an organic electroluminescent (EL) device with a high efficiency and an extended lifetime is obtained.

Organic EL Device Material

An organic EL device material of the invention contains a biscarbazole derivative host material represented by the formula (1) below.

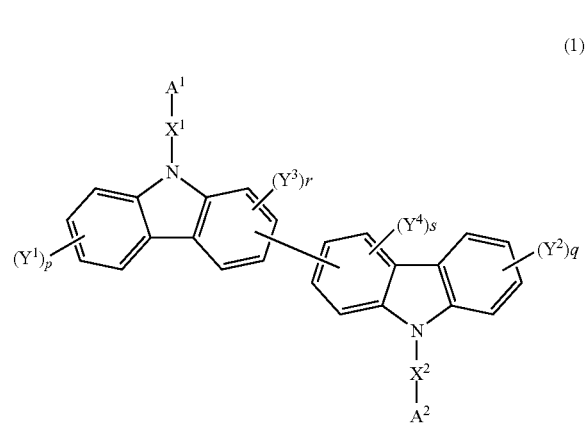

(1)

In the formula (1), $A^1$ represents a substituted or unsubstituted nitrogen-containing heterocyclic group having 1 to 30 of carbon atoms forming a ring (except a substituted or unsubstituted carbazolyl group and a substituted or unsubstituted indolyl group). $A^2$ represents a substituted or unsubstituted aromatic hydrocarbon group having 6 to 30 ring carbon atoms, or a substituted or unsubstituted nitrogen-containing heterocyclic group having 1 to 30 ring carbon atoms. $X^1$ and $X^2$ each are a linking group and independently represents:

a single bond;

a substituted or unsubstituted aromatic hydrocarbon group having 6 to 30 ring carbon atoms;

a substituted or unsubstituted fused aromatic hydrocarbon group having 6 to 30 ring carbon atoms;

a substituted or unsubstituted aromatic heterocyclic group having 2 to 30 ring carbon atoms; or a substituted or unsubstituted fused aromatic heterocyclic group having 2 to 30 ring carbon atoms.

$Y^1$ to $Y^4$ each independently represent a hydrogen atom, fluorine atom, cyano group, substituted or unsubstituted alkyl group having 1 to 20 carbon atoms, substituted or unsubstituted alkoxy group having 1 to 20 carbon atoms, substituted or unsubstituted haloalkyl group 1 to 20 carbon atoms, substituted or unsubstituted haloalkoxy group 1 to 20 carbon atoms, substituted or unsubstituted alkylsilyl group having 1 to 10 carbon atoms, substituted or unsubstituted arylsilyl group having 6 to 30 carbon atoms, substituted or unsubstituted aromatic hydrocarbon group having 6 to 30 ring carbon atoms, substituted or unsubstituted fused aromatic hydrocarbon group having 6 to 30 ring carbon atoms, substituted or unsubstituted aromatic heterocyclic group having 2 to 30 ring carbon atoms, or substituted or unsubstituted fused aromatic heterocyclic group having 2 to 30 ring carbon atoms. An adjacent set of $Y^1$ to $Y^4$ may be mutually bonded to form a cyclic structure. p and q each represent an integer of 1 to 4. r and s each represent an integer of 1 to 3. When p and q each are an integer of 2 to 4 and r and s each are an integer of 2 or 3, a plurality of $Y^1$ to $Y^4$ may be the same as or different from each other.

The biscarbazole derivative host material represented by the formula (1) is preferably represented by a formula (3) below.

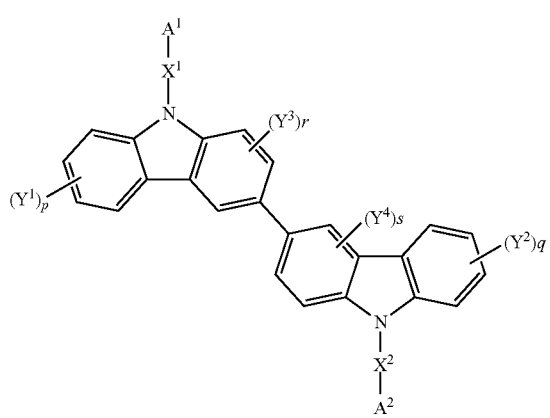

(3)

In the formula (3), $A^1$, $A^2$, $X^1$, $X^2$, $Y^1$ to $Y^4$, p, q, r and s represent the same as those represented by $A^1$, $A^2$, $X^1$, $X^2$, $Y^1$ to $Y^4$, p, q, r and s in the formula (1).

Further, in the formula (3), $A^1$ is preferably selected from the group consisting of a substituted or unsubstituted pyridine ring, pyrimidine ring and triazine ring.

Furthermore, in the formula (3), $A^1$ is preferably a substituted or unsubstituted pyrimidine ring and is particularly preferably represented by a formula (4) below.

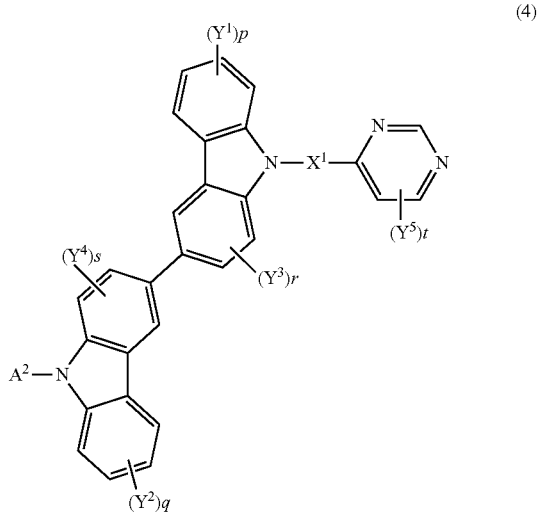

(4)

In the formula (4), $A^2$, $X^1$, $Y^1$ to $Y^4$, p, q, r and s represent the same as those represented by $A^2$, $X^1$, $Y^1$ to $Y^4$, p, q, r and s in the formula (1). $Y^5$ represents the same as those represented by $Y^1$ to $Y^4$ in the formula (1). t represents an integer of 1 to 3. When t is an integer of 2 or 3, a plurality of $Y^5$ may be the same as or different from each other.

In the formulae (1), (3) and (4), $X^1$ is preferably a single bond or a substituted or unsubstituted divalent aromatic hydrocarbon group having 6 to 30 ring carbon atoms, particularly preferably a benzene ring. When $X^1$ is a substituted or an unsubstituted benzene ring in the formulae (1), (3) and (4), $A^1$ and the carbazolyl group, which are bonded to $X^1$, are preferably in meta positions or para positions. Particularly, $X^1$ is unsubstituted para-phenylene.

In the formula (3) or (4), the pyridine ring, pyrimidine ring and triazine ring are each represented by the following formulae. In the formulae, Y and Y' represent a substituent. Examples of the substituent are the same groups as those represented by $Y^1$ to $Y^4$ as described above. Preferred examples thereof are a substituted or unsubstituted aromatic hydrocarbon group or fused aromatic hydrocarbon group having 6 to 30 ring carbon atoms, and a substituted or unsubstituted aromatic heterocyclic group or fused aromatic heterocyclic group having 2 to 30 ring carbon atoms. In the following formulae, * represents a bonding position to $X^1$ or $X^2$.

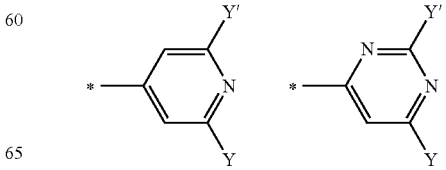

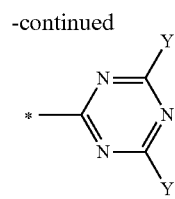

In the formulae (1), (3) and (4), the alkyl group, alkoxy group, haloalkyl group, haloalkoxy group and alkylsilyl group may be linear, branched or cyclic.

In the formulae (1), (3) and (4), examples of the alkyl group having 1 to 20 carbon atoms are a methyl group, ethyl group, propyl group, isopropyl group, n-butyl group, s-butyl group, isobutyl group, t-butyl group, n-pentyl group, n-hexyl group, n-heptyl group, n-octyl group, n-nonyl group, n-decyl group, n-undecyl group, n-dodecyl group, n-tridecyl group, n-tetradecyl group, n-pentadecyl group, n-hexadecyl group, n-heptadecyl group, n-octadecyl group, neo-pentyl group, 1-methylpentyl group, 2-methylpentyl group, 1-pentylhexyl group, 1-butylpentyl group, 1-heptyloctyl group, 3-methylpentyl group, cyclopentyl group, cyclohexyl group, cyclooctyl group and 3,5-tetramethylcyclohexyl group.

The alkoxy group having 1 to 20 carbon atoms is preferably an alkoxy group having 1 to 6 carbon atoms. Examples of the alkoxy group are a methoxy group, ethoxy group, propoxy group, butoxy group, pentyloxy group, and hexyloxy group.

The haloalkyl group having 1 to 20 carbon atoms is exemplified by an haloalkyl group provided by substituting the alkyl group having 1 to 20 carbon atoms with one or more halogen groups. The haloalkoxy group having 1 to 20 carbon atoms is exemplified by a haloalkoxy group provided by substituting the alkyl group having 1 to 20 carbon atoms by one or more halogen groups.

Examples of the alkylsilyl group having 1 to 10 carbon atoms are a trimethylsilyl group, triethylsilyl group, tributylsilyl group, dimethylethylsilyl group, dimethylisopropylsilyl group, dimethylpropylsilyl group, dimethylbutylsilyl group, dimethyl-tert-butylsilyl group and diethylisopropylsilyl group.

Examples of the arylsilyl group having 6 to 30 carbon atoms are a phenyldimethylsilyl group, diphenylmethylsilyl group, diphenyl-tert-butylsilyl group and triphenylsilyl group.

Examples of the aromatic heterocyclic group or fused aromatic heterocyclic group having 2 to 30 ring carbon atoms are a pyrroyl group, pyrazinyl group, pyridinyl group, indolyl group, isoindolyl group, furyl group, benzofuranyl group, isobenzofuranyl group, dibenzofuranyl group, dibenzothiophenyl group, quinolyl group, isoquinolyl group, quinoxalinyl group, carbazolyl group, phenanthridinyl group, acridinyl group, phenanthrolinyl group, thienyl group and a group formed from a pyridine ring, pyrazine ring, pyrimidine ring, pyridazine ring, triazine ring, indol ring, quinoline ring, acridine ring, pyrrolidine ring, dioxane ring, piperidine ring, morpholine ring, piperadine ring, carbazole ring, furan ring, thiophene ring, oxazole ring, oxadiazole ring, benzooxazole ring, thiazole ring, thiadiazole ring, benzothiazole ring, triazole ring, imidazole ring, benzoimidazole ring, pyrane ring and dibenzofuran ring.

Examples of the aromatic hydrocarbon group or fused aromatic hydrocarbon group having 6 to 30 ring carbon atoms are a phenyl group, naphthyl group, phenanthryl group, biphenyl group, terphenyl group, quaterphenyl group, fluoranthenyl group, triphenylenyl group and phenanthrenyl group.

When $A^1$, $A^2$, $X^1$, $X^2$ and $Y^1$ to $Y^5$ of the formulae (1), (3) and (4) each have one or more substituents, the substituents are preferably a linear, branched or cyclic alkyl group having 1 to 20 carbon atoms; linear, branched or cyclic alkoxy group having 1 to 20 carbon atoms; linear, branched or cyclic haloalkyl group having 1 to 20 carbon atoms; linear, branched or cyclic alkylsilyl group having 1 to 10 carbon atoms; arylsilyl group having 6 to 30 ring carbon atoms; cyano group; halogen atom; aromatic hydrocarbon group or fused aromatic hydrocarbon group having 6 to 30 ring carbon atoms; or aromatic heterocyclic group or fused aromatic heterocyclic group having 2 to 30 ring carbon atoms.

Examples of the linear, branched or cyclic alkyl group having 1 to 20 carbon atoms: Linear, branched or cyclic alkoxy group having 1 to 20 carbon atoms; linear, branched or cyclic haloalkyl group having 1 to 20 carbon atoms; linear, branched or cyclic alkylsilyl group having 1 to 10 carbon atoms; arylsilyl group having 6 to 30 ring carbon atoms; aromatic hydrocarbon group or fused aromatic hydrocarbon group having 6 to 30 ring carbon atoms; and aromatic heterocyclic group or fused aromatic heterocyclic group having 2 to 30 ring carbon atoms are the above-described groups. The halogen atom is exemplified by a fluorine atom.

Synthesis Example

Under a nitrogen atmosphere, 8 g (43.4 mmol) of trichloropyrimidine, 11.6 g (95.4 mmol) of phenylboronic acid, 1.83 g (1.74 mmol) of tetrakis (triphenylphosphine) palladium, 300 mL of toluene, and 130 mL of 2M sodium carbonate solution were sequentially mixed, and refluxed for 8 hours.

After the reaction solution was cooled down to room temperature, an organic layer was removed and an organic solvent was distilled away under reduced pressure. The obtained residue was refined by silica-gel column chromatography, such that 8.2 g of an intermediate body 3-1 was obtained at an yield of 71%.

Subsequently, under a nitrogen atmosphere, 8 g (29.9 mmol) of the intermediate body 3-1, 5.1 g (32.9 mmol) of p-chlorophenylboronic acid, 0.63 g (0.6 mmol) of tetrakis (triphenylphosphine) palladium, 60 mL of toluene, and 30 mL of 2M sodium carbonate solution were sequentially mixed, and refluxed for 8 hours.

After the reaction solution was cooled down to the room temperature, an organic layer was removed and an organic solvent was distilled away under reduced pressure. The obtained residue was refined by silica-gel column chromatography, such that 7.0 g of an intermediate body 3-2 was obtained at an yield of 68%.

Under an argon gas atmosphere, 6.5 g (18.9 mmol) of the intermediate body 3-2, 7.7 g (18.9 mmol) of the intermediate body 1-4, 0.085 g (0.38 mmol) of palladium acetate, 2.72 g (28.4 mmol) of sodium t-butoxide, 60 mL of anhydrous toluene, and 0.077 g (0.38 mmol) of tri-t-butyl phosphine were sequentially mixed, and heated for 6 hours at 90° C. After the reaction solution was cooled down to room temperature, an organic layer was removed and an organic solvent was distilled away under reduced pressure. The obtained residue was refined by silica-gel column chromatography, such that 7.8 g of a compound 3 was obtained at an yield of 58%.

FD-MS analysis consequently showed that m/e was equal to 715 while a calculated molecular weight was 715.

Synthesis of host materials is shown as follows:
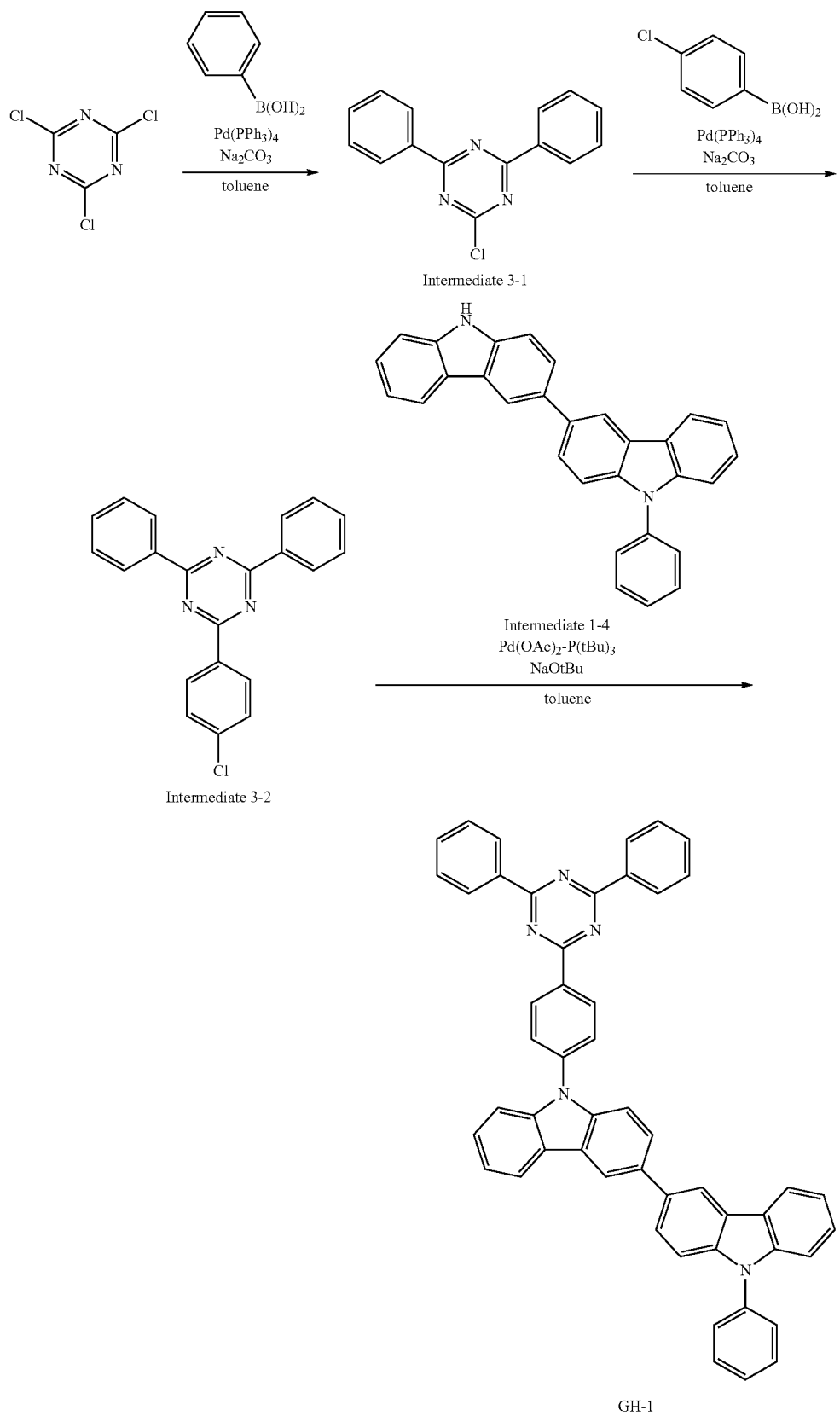
GH-1

EXAMPLES

The invention will be described in further detail with reference to the following examples and comparative examples. However, the invention is not limited by the following examples.

Manufacturing of Organic EL Device

Example 1

A glass substrate (size: 25 mm×75 mm×1.1 mm) having an ITO transparent electrode (manufactured by Geomatec Co., Ltd.) was ultrasonic-cleaned in isopropyl alcohol for five minutes, and then UV (Ultraviolet)/ozone-cleaned for 30 minutes.

After the glass substrate having the transparent electrode was cleaned, the glass substrate was mounted on a substrate holder of a vacuum deposition apparatus. A hole transporting (HT) layer was initially formed by vapor-depositing a 40-nm thick HT-1 and 20-nm thick HT-2 to cover the surface of the glass substrate where the transparent electrode lines were provided.

A green phosphorescent-emitting layer was obtained by co-depositing GH-1 as a green phosphorescent host and GD-1 as a green phosphorescent dopant onto the hole transporting layer in a thickness of 40 nm. The concentration of GD-1 was 15 wt %.

Then, a 40-nm-thick electron transporting (ET-1) layer, a 1-nm-thick LiF layer and a 80-nm-thick metal Al layer were sequentially formed to obtain a cathode. A LiF layer, which was an electron injectable electrode, was formed at a speed of 1 Å/sec.

Comparative Example 1

An organic EL device was prepared in the same manner as Example 1 except that CBP (4,4'-bis(N-carbazolyl)biphenyl) was used instead of GH-1 as the green phosphorescent host and Ir(ppy)$_3$ was used instead of GD-1 as the green phosphorescent dopant.

Comparative Example 2

An organic EL device was prepared in the same manner as Example 1 except that Ir(ppy)$_3$ was used instead of GD-1 as the green phosphorescent dopant.

Comparative Example 3

An organic EL device was prepared in the same manner as Example 1 except that CBP was used instead of GH-1 as the green phosphorescent host.

Structures of the devices according to Example 1 and Comparative Examples 1 to 3 are shown in Table 1.

TABLE 1

| | Hole Transporting Layer | Green Phosphorescent Emitting Layer | Electron Transporting Layer |
|---|---|---|---|
| Example 1 | HT-1/HT-2 | 15% GD-1 GH-1 | ET-1 |
| Comparative 1 | HT-1/HT-2 | 15% Ir(ppy)3 CBP | ET-1 |
| Comparative 2 | HT-1/HT-2 | 15% Ir(ppy)3 GH-1 | ET-1 |
| Comparative 3 | HT-1/HT-2 | 15% GD-1 CBP | ET-1 |

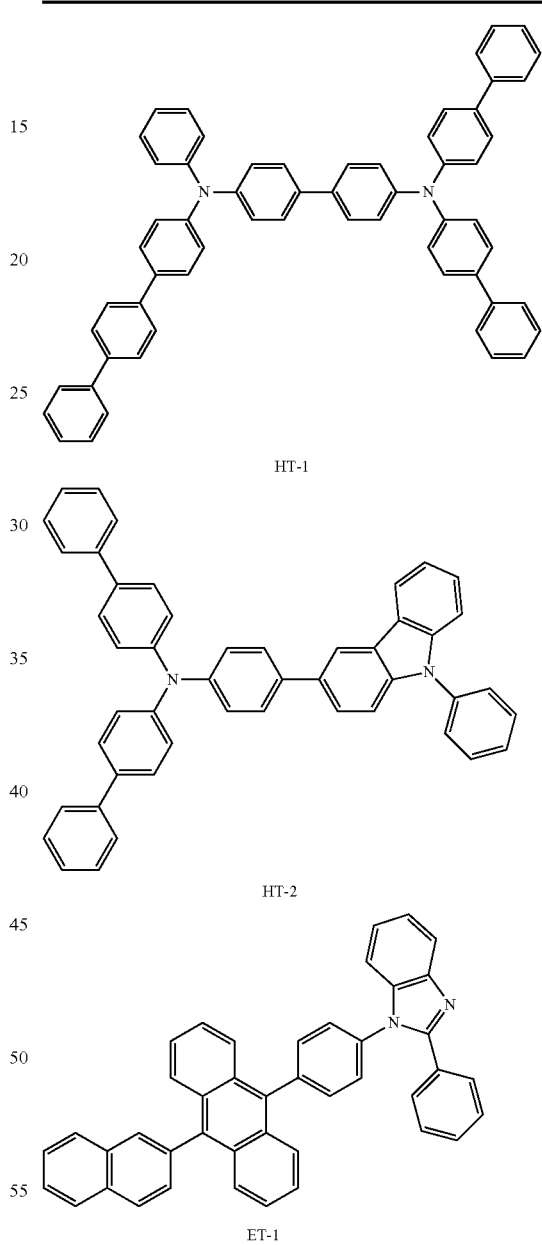

HT-1

HT-2

ET-1

Evaluation of Organic EL Device

The organic EL devices each manufactured in Example 1 and Comparative Examples 1 to 3 were driven by direct-current electricity of 1 mA/cm$^2$ to emit light, to measure the emission chromaticity, the luminescence (L) and the voltage. Using the measured values, the current efficiency (L/J) and luminous efficiency η (lm/W) were obtained. The results are shown in Table 2.

TABLE 2

| emitter | host | | Voltage (V) | Current Efficiency (cd/A) | Luminous Efficiency (lm/W) | Chromaticity (CIE Color System) | | LT80 @20,000 cd/m² (hrs) | LT50 @20,000 cd/m² (hrs) |
|---|---|---|---|---|---|---|---|---|---|
| | | | | | | x | y | | |
| GD-1 | GH-1 | Example 1 | 2.86 | 61.2 | 67.4 | 0.330 | 0.627 | 220 | 900 |
| Ir(ppy)3 | CBP | Comparative 1 | 4.29 | 9.0 | 6.6 | 0.293 | 0.635 | 15 | 80 |
| Ir(ppy)3 | GH-1 | Comparative 2 | 3.17 | 56.2 | 55.8 | 0.320 | 0.626 | 75 | 390 |
| GD-1 | CBP | Comparative 3 | 3.90 | 12.8 | 10.3 | 0.313 | 0.635 | 50 | 250 |

As is clear from Table 2, the organic EL device according to Example 1 exhibited excellent luminous efficiency and long lifetime as compared to the organic EL devices according to Comparative Examples 1 to 3.

What is claimed is:
1. An organic light emitting device comprising an anode, a cathode and an emissive layer, wherein the emissive layer is located between the anode and the cathode, and the emissive layer comprises a host material and a phosphorescent emitter material, wherein:
the host material has the chemical structure represented by formula (3):

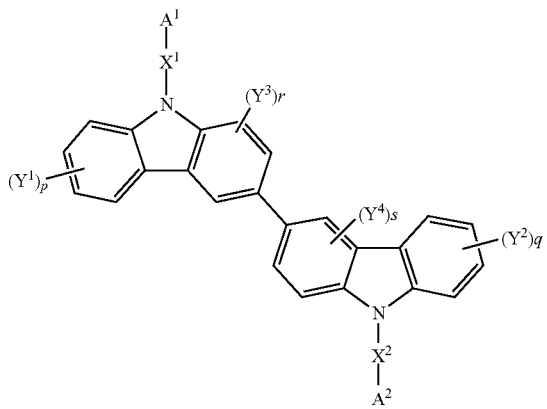

(3)

wherein $A^1$ is selected from the group consisting of a substituted or unsubstituted pyridine ring, pyrimidine ring, and triazine ring;
$A^2$ represents a substituted or unsubstituted aromatic hydrocarbon group having 6 to 30 ring-forming carbon atoms or a substituted or unsubstituted nitrogen-containing heterocyclic group having 1 to 30 ring-forming carbon atoms;
$X^1$ and $X^2$ are bonding groups, $X^1$ and $X^2$ respectively independently representing a single bond and a substituted or unsubstituted aromatic hydrocarbon group having 6 to 30 ring-forming carbon atoms;
$Y^1$ to $Y^4$ independently represent;
a hydrogen atom;
a fluorine atom;
a cyano group;
a substituted or unsubstituted alkyl group having 1 to 20 carbon atoms;
a substituted or unsubstituted alkoxy group having 1 to 20 carbon atoms;
a substituted or unsubstituted haloalkyl group having 1 to 20 carbon atoms;
a substituted or unsubstituted haloalkoxy group having 1 to 20 carbon atoms;
a substituted or unsubstituted alkylsilyl group having 1 to 10 carbon atoms;
a substituted or unsubstituted arylsilyl group having 6 to 30 carbon atoms;
a substituted or unsubstituted aromatic hydrocarbon group having 6 to 30 ring-forming carbon atoms;
a substituted or unsubstituted condensed aromatic hydrocarbon group having 6 to 30 ring-forming carbon atoms;
a substituted or unsubstituted aromatic heterocyclic group having 2 to 30 ring-forming carbon atoms; or
a substituted or unsubstituted condensed aromatic heterocyclic group having 2 to 30 ring-forming carbon atoms, adjacent ones of $Y^1$ to $Y^4$ being bondable with each other to form a ring structure, and
p and q represent integers in a range from 1 to 4 and r and s represent integers in a range from 1 to 3, $Y^1$ to $Y^4$ being the same as or different from each other when p and q represent integers in a range from 2 to 4 and r and s represent integers in a range from 2 to 3; and
the phosphorescent emitter material comprises a phosphorescent organometallic complex having a substituted chemical structure represented by one of the following partial chemical structures of the formula:

LL'L"M wherein M is a metal that forms octahedral complexes, L, L', L" are equivalent or inequivalent bidentate ligands wherein each L comprises a substituted or unsubstituted phenylpyridine ligand coordinated to M through an $sp^2$ hybridized carbon and N; and
one of L, L' and L" is inequivalent to at least one of the other two,
wherein the phosphorescent emitter material comprises a phosphorescent organometallic compound having a substituted chemical structure represented by the following chemical structure:

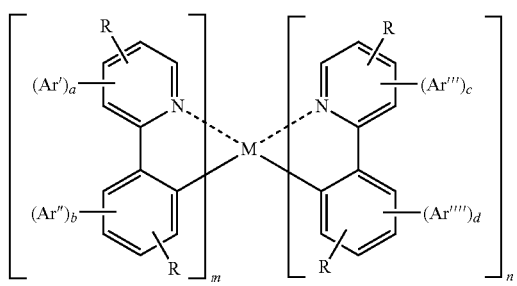

where each R is independently selected from the group consisting of H, alkyl, alkenyl, alkynyl, alkylaryl, CN, CF$_3$, C$_n$F$_{2n+1}$, trifluorovinyl, CO$_2$R, C(O)R, NR$_2$, NO$_2$, OR, halo, aryl, heteroaryl, substituted aryl, substituted heteroaryl or a heterocyclic group;

Ar', Ar'', Ar''' and Ar'''' each independently represent a substituted or unsubstituted aryl or heteroaryl unfused substituent on the phenylpyridine ligand;

a is 0 or 1;

b is 0 or 1;

c is 0 or 1;

d is 0 or 1;

m is 1 or 2;

n is 1 or 2;

m+n is the maximum number of ligands that can be coordinated to M, and wherein at least one of a, b, c, and d is 1 and when at least one of a and b is 1 and at least one of b and c is 1, at least one of Ar' and Ar'' is different from at least one of Ar''' and Ar''''.

2. The organic light emitting device of claim 1, wherein the host material has the chemical structure represented by the formula:

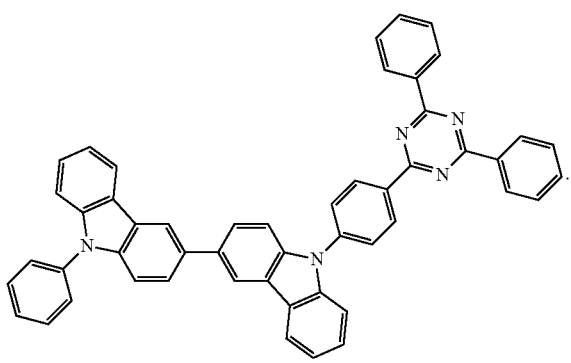 [SMILES: c1ccc(-c2nc(-c3ccccc3)nc(-c3ccc(-n4c5ccccc5c5cc(-c6ccc7c(c6)c6ccccc6n7-c6ccccc6)ccc54)cc3)n2)cc1]

3. The organic light emitting device of claim 1, wherein the triplet energy of the host material is from about 2.0 eV to about 2.8 eV.

4. The organic light emitting device of claim 1, wherein the phosphorescent emitter material comprises a phosphorescent organometallic complex wherein the substituted chemical structure is substituted with at least two methyl groups.

5. The organic light emitting device of claim 1, wherein the phosphorescent emitter material comprises a metal complex, and the metal complex comprises a metal atom selected from Ir, Pt, Os, Au, Cu, Re, Ru and a ligand.

6. The organic light emitting device of claim 5, wherein the metal complex has an ortho-metal bond.

7. The organic light emitting device of claim 6, wherein the metal atom is Ir.

8. The organic light emitting device of claim 1, wherein the phosphorescent emitter material comprises a phosphorescent organometallic complex having a substituted chemical structure represented by the following partial chemical structure:

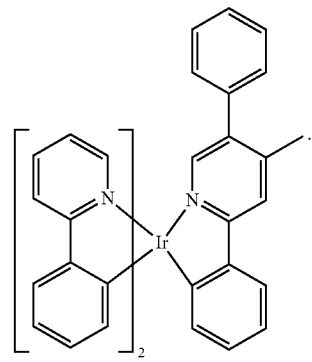

(GD-1)

9. An organic light emitting device comprising an anode, a cathode and an emissive layer, wherein the emissive layer is located between the anode and the cathode, and the emissive layer comprises a host material and a phosphorescent emitter material, wherein:

the host material has the chemical structure represented by formula (3):

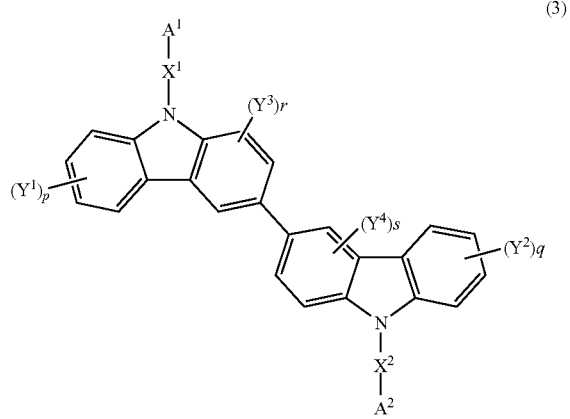

(3)

wherein A$^1$ is selected from the group consisting of a substituted or unsubstituted pyridine ring, pyrimidine ring, and triazine ring;

A$^2$ represents a substituted or unsubstituted aromatic hydrocarbon group having 6 to 30 ring-forming carbon atoms or a substituted or unsubstituted nitrogen-containing heterocyclic group having 1 to 30 ring-forming carbon atoms;

X$^1$ and X$^2$ are bonding groups, X$^1$ and X$^2$ respectively independently representing a single bond and a substituted or unsubstituted aromatic hydrocarbon group forming carbon atoms;

Y$^1$ to Y$^4$ independently represent, a hydrogen atom, a fluorine atom, a cyano group, a substituted or unsubstituted alkyl group having 1 to 20 carbon atoms, a substituted or unsubstituted alkoxy group having 1 to 20 carbon atoms, a substituted or unsubstituted haloalkyl group having 1 to 20 carbon atoms, a substituted or unsubstituted haloalkoxy group having 1 to 20 carbon atoms, a substituted or unsubstituted alkylsilyl group having 1 to 10 carbon atoms, a substituted or unsubstituted arylsilyl group having 6 to 30 carbon atoms, a substituted or unsubstituted aromatic hydrocarbon group having 6 to 30 ring-forming carbon atoms, a substituted or unsubstituted condensed aromatic hydrocarbon group having 6 to 30 ring-forming carbon atoms, a substituted or unsubstituted aromatic heterocyclic group having 2 to 30 ring-forming carbon atoms; or a substituted or unsubstituted condensed aromatic heterocyclic group having 2 to 30 ring-forming carbon atoms, adjacent ones of $Y^1$ to $Y^4$ being bondable with each other to form a ring structure, and p and q represent integers in a range from 1 to 4 and r and s represent integers in a range from 1 to 3, $Y^1$ to $Y^4$ being the same as or different from each other when p and q represents integers in a range from 2 to 4 and r and s represent integers in a range from 2 to 3; and the phosphorescent emitter material comprises a phosphorescent organometallic complex having a substituted chemical structure represented by one of the following partial chemical structures of the formula:

LL'L"M wherein M is a metal that forms octahedral complexes;
L, L', L" are equivalent or inequivalent bidentate ligands wherein each L comprises a substituted or unsubstituted phenylpyridine ligand coordinated to M through an sp$^2$ hybridized carbon and N; and
one of L, L' and L" is inequivalent to at least one of the other two;

wherein the host material comprises an unsubstituted aromatic hydrocarbon compound having the chemical structure represented by the formula:

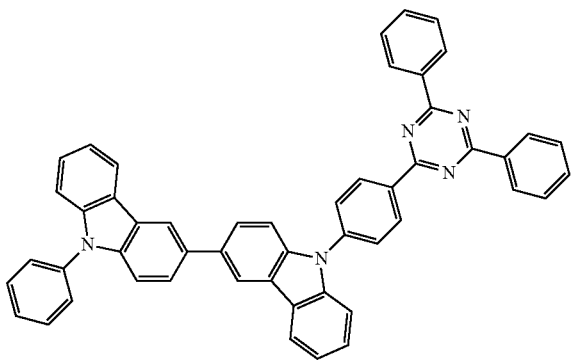 [SMILES: c1ccc(-c2nc(-c3ccccc3)nc(-c3ccc(-n4c5ccccc5c5cc(-c6ccc7c(c6)c6ccccc6n7-c6ccccc6)ccc54)cc3)n2)cc1]

and wherein the phosphorescent emitter material comprises a phosphorescent organometallic compound having a substituted chemical structure represented by the following chemical structure:

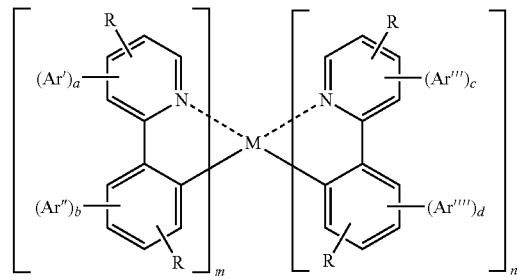

where each R is independently selected from the group consisting of H, alkyl, alkenyl, alkynyl, alkylaryl, CN, CF$_3$, C$_n$F$_{2n+1}$, trifluorovinyl, CO$_2$R, C(O)R, NR$_2$, NO$_2$, OR, halo, aryl, heteroaryl, substituted aryl, substituted heteroaryl or a heterocyclic group;

Ar', Ar", Ar'" and Ar"" each independently represent a substituted or unsubstituted aryl or heteroaryl unfused substituent on the phenylpyridine ligand;

a is 0 or 1;

b is 0 or 1;

c is 0 or 1;

d is 0 or 1;

m is 1 or 2;

n is 1 or 2;

m+n is the maximum number of ligands that can be coordinated to M, and wherein at least one of a, b, c, and d is 1 and when at least one of a and b is 1 and at least one of b and c is 1, at least one of Ar' and Ar" is different from at least one of Ar'" and Ar"".

10. The organic light emitting device of claim 9, wherein at least one of the phosphorescent materials contained in the light emitting layer has a maximum value of 500 nm or more and 720 nm or less in a light emitting wavelength.

\* \* \* \* \*